(12) United States Patent
Li

(10) Patent No.: US 12,117,338 B2
(45) Date of Patent: Oct. 15, 2024

(54) TERMINAL DEVICE WITH AMBIENT LIGHT DETECTION FUNCTION AND AMBIENT LIGHT DETECTION METHOD

(71) Applicant: HONOR DEVICE CO., LTD., Shenzhen (CN)

(72) Inventor: Chenlong Li, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 17/919,833

(22) PCT Filed: May 20, 2022

(86) PCT No.: PCT/CN2022/094237
§ 371 (c)(1),
(2) Date: Oct. 19, 2022

(87) PCT Pub. No.: WO2023/016028
PCT Pub. Date: Feb. 16, 2023

(65) Prior Publication Data
US 2024/0255345 A1    Aug. 1, 2024

(30) Foreign Application Priority Data

Aug. 10, 2021    (CN) .......................... 202110914766.0

(51) Int. Cl.
*G09G 5/00* (2006.01)
*G01J 1/42* (2006.01)
(Continued)

(52) U.S. Cl.
CPC .............. *G01J 1/4204* (2013.01); *G01J 1/44* (2013.01); *G09G 3/20* (2013.01);
(Continued)

(58) Field of Classification Search
CPC ............ G09G 3/20; G09G 2320/0626; G09G 2360/144; G01J 1/44; G01J 1/4204; G01J 2001/0626
See application file for complete search history.

(56) References Cited

U.S. PATENT DOCUMENTS 10,764,414 B2    9/2020    Zhang et al.
11,262,235 B2    3/2022    Sun et al.
(Continued)

FOREIGN PATENT DOCUMENTS

CN    206490702 U    9/2017
CN    107767835 A    3/2018
(Continued)

*Primary Examiner* — Joe H Cheng
(74) *Attorney, Agent, or Firm* — WOMBLE BOND DICKINSON (US) LLP

(57) ABSTRACT

A terminal device with an ambient light detection function and an ambient light detection method are provided. The terminal device includes at least two photosensitive units arranged at a short distance, and the at least two photosensitive units are located in a slit area formed by a middle frame and a side wall of a display screen. Transparent black ink and opaque ink are respectively deployed in vertical projection areas of photosensitive areas of the at least two photosensitive units on cover glass, resulting in asymmetry in external ambient light energy sensed by the at least two photosensitive units. A processor performs differential calculation based on light energy sensed by the two photosensitive units by using a particular method, removes the impact of the light leakage generated by the display screen, and obtains brightness of peripheral real ambient light, to adjust brightness of the display screen.

20 Claims, 9 Drawing Sheets

(51) Int. Cl.
  *G01J 1/44* (2006.01)
  *G09G 3/20* (2006.01)
(52) U.S. Cl.
  CPC ............. *G01J 2001/444* (2013.01); *G09G 2320/0626* (2013.01); *G09G 2360/144* (2013.01)

(56) References Cited

U.S. PATENT DOCUMENTS

| | | | |
|---|---|---|---|
| 11,966,262 B2 * | 4/2024 | Li | G01J 1/0271 |
| 2009/0167676 A1 | 7/2009 | Edwards et al. | |
| 2013/0048837 A1 * | 2/2013 | Pope | G01J 1/0407 250/214.1 |
| 2014/0267202 A1 | 9/2014 | Zheng | |
| 2016/0054175 A1 * | 2/2016 | Jia | G01J 1/0233 250/216 |
| 2018/0121703 A1 * | 5/2018 | Jung | G06F 3/041 |
| 2018/0337219 A1 * | 11/2018 | Rhee | G02B 5/3083 |
| 2020/0359510 A1 * | 11/2020 | Lee | G06V 40/1306 |
| 2021/0271295 A1 | 9/2021 | Li et al. | |

FOREIGN PATENT DOCUMENTS

| | | |
|---|---|---|
| CN | 107979663 A | 5/2018 |
| CN | 108257581 A | 7/2018 |
| CN | 209805867 U | 12/2019 |
| CN | 111785230 A | 10/2020 |
| CN | 112087539 A | 12/2020 |
| CN | 112133723 A | 12/2020 |
| CN | 112484850 A | 3/2021 |
| EP | 3813341 A1 | 4/2021 |

\* cited by examiner

TERMINAL DEVICE WITH AMBIENT LIGHT DETECTION FUNCTION AND AMBIENT LIGHT DETECTION METHOD

CROSS-REFERENCE TO RELATED APPLICATIONS

This application is a National Stage of International Application No. PCT/CN2022/094237, filed on May 20, 2022, which claims priority to Chinese Patent Application No. 202110914766.0, filed on Aug. 10, 2021, both of which are hereby incorporated by reference in their entireties.

TECHNICAL FIELD

This application relates to the field of terminals, and in particular, to a terminal device with an ambient light detection function and an ambient light detection method.

BACKGROUND

A terminal device can sense brightness of a light ray in an environment of the terminal device by using an ambient light function. To implement the ambient light function, an ambient light sensor usually needs to be deployed on the terminal device. In the context of a full screen and a large screen-to-body ratio, a currently common solution is to dispose an ambient light sensor below a display screen of the terminal device. During application of such a solution, the ambient light sensor is affected by brightness of light emitted by the display screen while the ambient light sensor receives actual ambient light brightness of the periphery, resulting in an inaccurate result of detection on the actual ambient light brightness by the ambient light sensor.

To reduce impact of the light emitted by the display screen on the result of the detection by the ambient light sensor, display content above the ambient light can be obtained and dynamically compensated based on a special ambient light algorithm, to prevent interference of the light emitted by the display screen. However, accuracy of such a method is not high, leading to relatively high power consumption of the terminal device, and there are restricted specifications of the display screen and some special requirements for the ambient light sensor.

In addition, another type of technology is to use display refresh of the screen to generate a short time period of total darkness for collection of a peripheral environment. Similarly, such a solution has requirements for some display specifications of the screen and refresh timing stability of the screen, and has dependence on a working mode of the sensor, and therefore cannot be used in some scenarios.

There is an urgent need in the industry for an ambient light solution that is simple to implement, has no dependence on display features of the screen, and has relatively low requirements for the sensor.

SUMMARY

This application provides a terminal device with an ambient light detection function and an ambient light detection method that help improve ambient light detection accuracy of the terminal device and have good adaptability, and can be decoupled from a display screen and have good scalability.

According to a first aspect, this application provides a terminal device with an ambient light detection function, including: cover glass, a display screen, an ambient light sensor assembly, and a middle frame, where the display screen is located below the cover glass, the middle frame is located below the display screen and around the display screen, the middle frame and a side wall of the display screen form a slit area, the display screen includes an active area (active area, AA) and a non-AA, and the ambient light sensor assembly is located in the slit area, or the ambient light sensor assembly is located in the non-AA of the display screen; the ambient light sensor assembly includes at least two photosensitive units, and a distance between a first photosensitive unit and a second photosensitive unit in the at least two photosensitive units is less than or equal to a preset threshold; and transparent black ink is deployed in a vertical projection area of a photosensitive area of the first photosensitive unit on the cover glass, and opaque ink or low light transmittance ink is deployed in a vertical projection area of a photosensitive area of the second photosensitive unit on the cover glass.

With reference to the first aspect, in a possible implementation of the first aspect, the first photosensitive unit is configured to sense light energy of peripheral ambient light that is of the terminal device and that passes through the transparent black ink and light energy of a light leakage of the display screen to obtain first light energy, where the light leakage of the display screen is light leaked from the non-AA by light generated by a light-emitting unit when the AA displays an image; and the second photosensitive unit is configured to sense light energy of peripheral ambient light that is of the terminal device and that passes through the opaque ink or the low light transmittance ink, partial peripheral ambient light energy that passes through the transparent black ink, and the light energy of the light leakage of the display screen to obtain second light energy, where the first light energy is greater than the second light energy.

With reference to the first aspect, in a possible implementation of the first aspect, the terminal device further includes a processor, where the processor is configured to remove, in real time based on the first light energy and the second light energy by using a differential processing-based method, impact of the energy of the light leakage generated by the display screen during content display, to obtain true brightness of the peripheral ambient light to adjust brightness of the display screen.

The terminal device provided in this application is provided with at least two photosensitive units arranged at a short distance, light energy that is of light leakages and that is sensed by the at least two photosensitive units arranged at a short distance when the display screen displays different content is basically the same, and two types of inks with different transmittances are respectively deployed on cover glass in vertical projection areas of two photosensitive units, making transmittances of the two projection areas significantly different, that is, there is a relatively large difference between light energy of peripheral ambient light sensed by a photosensitive unit corresponding to an area deployed with transparent black ink and light energy of peripheral ambient light sensed by a photosensitive unit corresponding to an area deployed with opaque ink. In this case, when processing the light energy sensed by the photosensitive units, the terminal device can remove, in real time by using a differential processing-based method, impact of the energy of the light leakage generated by the display screen during content display, to obtain real ambient light to adjust brightness of the display screen. The foregoing terminal device with an ambient light detection function helps improve ambient light detection accuracy of the terminal device, and has good adaptability and low costs.

The foregoing photosensitive units arranged at a short distance may be understood as that a distance between the two photosensitive units is less than or equal to a preset threshold. For example, the preset threshold may be 3 millimeters (millimeter, mm).

In this application, the foregoing ambient light sensor assembly may be a device that includes at least two photosensitive units. It should be understood that, the at least two photosensitive units may be deployed on a same sensor or may be respectively deployed on different sensors. This is not limited in this application.

It should be understood that, the light leakage of the non-AA is related to content displayed on the display screen, brightness of the display screen, and the like, and is not related to the ambient light.

It should be understood that, the peripheral ambient light energy that is sensed by the second photosensitive unit and that passes through the transparent black ink is a small part of the light energy that is of the peripheral ambient light passing through the transparent black ink and that is sensed by the first photosensitive unit. This is because a transmittance of the opaque ink or the low light transmittance ink deployed in the vertical projection area of the photosensitive area of the second photosensitive unit is significantly less than a transmittance of the transparent black ink deployed in the vertical projection area of the photosensitive area of the first photosensitive unit.

It should be further understood that, the foregoing area of the transparent black ink may be further extended to a partial area of the vertical projection area of the second photosensitive unit on the cover glass, that is, the foregoing area of the transparent black ink may be extended in any case provided that it can be ensured that there is a significant difference between two ambient light sensors in sensing the peripheral ambient light energy that passes through the ink area. A size and a shape of the ink area is not limited in this application.

The foregoing AA is an effective display area, and usually refers to a graphical display area, that is, an area that can be detected by the terminal device when a user touches a panel of the terminal device.

With reference to the first aspect, in a possible implementation of the first aspect, the terminal device further includes a small board, where the small board is located on a lower surface of the middle frame away from the display screen; and the ambient light sensor assembly is located at a vertical projection location of the slit area on the small board.

It should be understood that, in the ambient light sensor assembly, the middle frame is apertured to ensure that an optical path is not blocked by the middle frame or another device in large proportions.

With reference to the first aspect, in a possible implementation of the first aspect, the terminal device further includes a copper sheet or a black foam, where the copper sheet or the black foam is located below the AA of the display screen.

The foregoing copper sheet or black foam is configured to block the light leakage in the AA of the display screen.

The foregoing copper sheet or black foam may alternatively be another material with a shading capability. This is not limited in this application.

It should be understood that, the foregoing copper sheet or black foam may alternatively block a part of the non-AA. For example, the copper sheet or black foam may be located below the AA of the display screen and below a part of the non-AA.

It should be further understood that, the foregoing ambient light sensor assembly may alternatively be located at a screen edge location with a particular transmittance in the non-AA of the display screen.

With reference to the first aspect, in a possible implementation of the first aspect, when the ambient light sensor assembly is located in the slit area, the second photosensitive unit and the first photosensitive unit are arranged side by side along a length direction of the slit area.

With reference to the first aspect, in a possible implementation of the first aspect, when the ambient light sensor assembly is located in the non-AA of the display screen, the second photosensitive unit is located on any side around the first photosensitive unit.

With reference to the first aspect, in a possible implementation of the first aspect, the cover glass further includes uniform light white ink, where the uniform light white ink covers the transparent black ink and the opaque ink.

With reference to the first aspect, in a possible implementation of the first aspect, the uniform light white ink is configured to: increase a diffusion effect of a light ray, and reduce a rate of attenuation of light energy received by the photosensitive unit through the uniform light white ink under conditions of incidence of the peripheral ambient light at different angles; the first photosensitive unit is configured to sense light energy of peripheral ambient light that is of the terminal device and that passes through the transparent black ink and the uniform light white ink and the light energy of the light leakage of the display screen, to obtain third light energy; and the second photosensitive unit is configured to sense light energy of peripheral ambient light that is of the terminal device and that passes through the opaque ink and the uniform light white ink or that passes through the low light transmittance ink and the uniform light white ink, light energy of partial peripheral ambient light that passes through the transparent black ink and the uniform light white ink, and the light energy of the light leakage of the display screen, to obtain fourth light energy, where the third light energy is greater than the fourth light energy.

With reference to the first aspect, in a possible implementation of the first aspect, the processor is further configured to remove, based on the third light energy and the fourth light energy by using the differential processing method, the light energy of the light leakage generated by the display screen during the content display, to obtain brightness of the peripheral ambient light to adjust true brightness of the display screen.

It should be understood that, the peripheral ambient light energy that is sensed by the second photosensitive unit and that passes through the transparent black ink and the uniform light white ink is a small part of the light energy that is of the peripheral ambient light passing through the transparent black ink and the uniform light white ink and that is sensed by the first photosensitive unit.

On the one hand, the uniform light white ink deployed in this embodiment of this application can increase diffuse reflection of light after string light generated by the side wall of the display screen passes through the uniform light white ink, thereby further reducing a difference between light energy of light leakages of the screen that is sensed by two photosensitive units at physically different spatial locations, and ensuring that light leakage parts of the screen generate as consistent light leakage impact as possible on the two photosensitive units. On the other hand, sudden changes in ambient light data due to scenarios in which a light source has an angle with respect to a surface of the display screen of the terminal device can be effectively suppressed, thereby further ensuring stability of the peripheral ambient light sensed by the two photosensitive units in scenarios of different angles with respect to the light source.

With reference to the first aspect, in a possible implementation of the first aspect, the first photosensitive unit is located between the second photosensitive unit and a third photosensitive unit in the at least two photosensitive units; a distance between the first photosensitive unit and the second photosensitive unit is less than or equal to the preset threshold, and a distance between the first photosensitive unit and the third photosensitive unit is less than or equal to the preset threshold; and opaque ink or low light transmittance ink is deployed in a vertical projection area of a photosensitive area of the third photosensitive unit on the cover glass.

With reference to the first aspect, in a possible implementation of the first aspect, the third photosensitive unit is configured to sense light energy of peripheral ambient light that is of the terminal device and that passes through the opaque ink or the low light transmittance ink, partial peripheral ambient light energy that passes through the transparent black ink, and the light energy of the light leakage of the display screen to obtain fifth light energy, where the first light energy is greater than the fifth light energy.

With reference to the first aspect, in a possible implementation of the first aspect, the processor is configured to calculate brightness of first peripheral ambient light based on the first ambient light energy and the second ambient light energy; calculate brightness of second peripheral ambient light based on the first light energy and the fifth light energy; and calculate an average value of the brightness of the first peripheral ambient light and the brightness of the second peripheral ambient light to adjust the brightness of the display screen.

In this embodiment of this application, three photosensitive units are deployed, and two differential pairs can be formed, so that fluctuations of the ambient light data brought by complex display content of the display screen can be better counteracted.

With reference to the first aspect, in a possible implementation of the first aspect, the terminal device further includes a proximity light receiving sensor, where the proximity light receiving sensor is located on any side around the ambient light sensor assembly; and the proximity light receiving sensor is configured to sense proximity light.

In this embodiment of this application, a proximity light receiving sensor is provided on any side around the ambient light sensor assembly, so that functional integration can be achieved for a scenario in which the sensor can be used for both proximity light and ambient light.

With reference to the first aspect, in a possible implementation of the first aspect, when a wavelength of the peripheral ambient light is 550 nanometers, a light transmittance of the transparent black ink is 5%, and a light transmittance of the opaque ink or the low light transmittance ink is less than 5% c.

There is a relatively large difference between transmittances of the foregoing two types of deployed ink to create asymmetry.

With reference to the first aspect, in a possible implementation of the first aspect, the middle frame includes an adhesive spilling groove, where the adhesive spilling groove is located in the middle frame on one side of the ambient light sensor assembly, and the adhesive spilling groove is configured to carry an adhesive spilt between the cover glass and the housing.

The adhesive spilling groove provided in this embodiment of this application can effectively prevent an adhesive from being spilt between the cover glass and the housing, thereby improving consistency of slit areas, and further improving a photosensitive effect of the ambient light sensor assembly.

With reference to the first aspect, in a possible implementation of the first aspect, the terminal device further includes an optically clear adhesive OCA, a polarizer, a support layer, a network adhesive, and a polyimide PI layer, where the OCA is located between the cover glass and the polarizer, the display screen is located between the polarizer and the support layer, the network adhesive is located between the support layer and the PI layer, and the PI layer is located above the middle frame.

According to a second aspect, this application provides an ambient light detection method, applied to a terminal device that includes cover glass, a display screen, an ambient light sensor assembly, and a middle frame and that has an ambient light detection function, where the ambient light sensor includes at least two photosensitive units, the display screen includes an active area AA and a non-AA, transparent black ink is deployed in a vertical projection area of a photosensitive area of the first photosensitive unit on the cover glass, opaque ink or low light transmittance ink is deployed in a vertical projection area of a photosensitive area of the second photosensitive unit on the cover glass, and the method includes: sensing, by using the first photosensitive unit in the at least two photosensitive units, light energy of peripheral ambient light that is of the terminal device and that passes through the transparent black ink and light energy of a light leakage of the display screen to obtain first light energy, where the light leakage of the display screen is light leaked from the non-AA by light generated by a light-emitting unit when the AA displays an image; sensing, by using the second photosensitive unit in the at least two photosensitive units, light energy of peripheral ambient light that is of the terminal device and that passes through the opaque ink or the low light transmittance ink, partial peripheral ambient light energy that passes through the transparent black ink, and the light energy of the light leakage of the display screen to obtain second light energy, where the first light energy is greater than the second light energy; and removing, based on the first light energy and the second light energy by using a differential processing method, the light energy of the light leakage generated by the display screen during content display, to obtain true brightness of the peripheral ambient light to adjust brightness of the display screen.

With reference to the second aspect, in a possible implementation of the second aspect, the cover glass includes uniform light white ink, and the method further includes: increasing diffusion of the light leakage of the display screen and the peripheral ambient light by using the uniform light white ink; the sensing, by using the first photosensitive unit in the at least two photosensitive units, light energy of peripheral ambient light that is of the terminal device and that passes through the transparent black ink and light energy of a light leakage of the display screen to obtain first light energy includes: sensing, by using the first photosensitive unit, light energy of peripheral ambient light that is of the terminal device and that passes through the transparent black ink and the uniform light white ink and the light energy of the light leakage of the display screen, to obtain third light energy; the sensing, by using the second photosensitive unit in the at least two photosensitive units, light energy of peripheral ambient light that is of the terminal device and that passes through the opaque ink or the low light transmittance ink, partial peripheral ambient light energy that passes through the transparent black ink, and the light energy of the light leakage of the display screen to obtain second light energy includes: sensing, by using the second photosensitive unit, light energy of peripheral ambient light that is of the terminal device and that passes through the opaque ink and the uniform light white ink or that passes through the low light transmittance ink and the uniform light white ink, light energy of partial peripheral ambient light that passes through the transparent black ink and the uniform light white ink, and the light energy of the light leakage of the display screen, to obtain fourth light energy, where the third light energy is greater than the fourth light energy; and the removing, based on the first light energy and the second light energy by using a differential processing method, the light energy of the light leakage generated by the display screen during content display, to obtain true brightness of the peripheral ambient light to adjust brightness of the display screen includes: removing, based on the third light energy and the fourth light energy by using the differential processing method, the light energy of the light leakage generated by the display screen during the content display, to obtain the true brightness of the peripheral ambient light to adjust the brightness of the display screen.

With reference to the second aspect, in a possible implementation of the second aspect, the method further includes: sensing, by using a third photosensitive unit in the at least two photosensitive units, light energy of peripheral ambient light that is of the terminal device and that passes through the opaque ink or the low light transmittance ink, peripheral ambient light energy that passes through the transparent black ink, and the light energy of the light leakage of the display screen to obtain fifth light energy, where the first light energy is greater than the fifth light energy; and the removing, based on the first light energy and the second light energy by using a differential processing method, the light energy of the light leakage generated by the display screen during content display, to obtain true brightness of the peripheral ambient light to adjust brightness of the display screen includes: calculating brightness of first peripheral ambient light based on the first ambient light energy and the second ambient light energy; calculating brightness of second peripheral ambient light based on the first light energy and the fifth light energy; and calculating an average value of the brightness of the first peripheral ambient light and the brightness of the second peripheral ambient light to adjust the brightness of the display screen.

With reference to the second aspect, in a possible implementation of the second aspect, when a wavelength of the peripheral ambient light is 550 nanometers, a light transmittance of the transparent black ink is 5%, and a light transmittance of the opaque ink or the low light transmittance ink is less than 5% c.

According to the ambient light detection method provided in this application, the first light energy is obtained through the first photosensitive unit in at least two photosensitive units, the second light energy is obtained through the second photosensitive unit in the at least two photosensitive units, and the obtained first light energy is greater than the second light energy. In this way, the light energy of the light leakage of the display screen can be removed based on the obtained different light energy by using the differential processing method, to obtain true brightness of the peripheral ambient light to adjust brightness of the display screen. The method helps improve ambient light detection accuracy of the terminal device and has good adaptability and low costs.

DESCRIPTION OF EMBODIMENTS

The following describes technical solutions of this application with reference to accompanying drawings.

In the embodiments of this application, terms such as "first" and "second" are used to distinguish same or similar items with a basically same function and purpose. For example, an interface of a first target function and an interface of the second target function are used to distinguish between different response interfaces, and are not intended to limit a sequence thereof. A person skilled in the art may understand that the terms such as "first" and "second" do not define a quantity and an execution sequence, and the terms such as "first" and "second" do not indicate a definite difference.

It should be noted that in this application, the term "exemplarily" or "for example" is used to represent giving an example, an illustration, or a description. Any embodiment or design scheme described as "exemplarily" or "for example" in this application should not be explained as being more preferred or having more advantages than another embodiment or design scheme. Exactly, use of the term "exemplarily" or "for example" or the like is intended to present a related concept in a specific manner.

The terminal device provided in the embodiments of this application has a display screen and an ambient light sensor. The terminal device may also be referred to as a terminal (terminal), user equipment (user equipment, UE), a mobile station (mobile station, MS), a mobile terminal (mobile terminal, MT), and the like. The terminal device may be a mobile phone (mobile phone), a smart TV, a wearable device, a tablet computer (Pad), a computer having a wireless transmission and receiving function, a virtual reality (Virtual Reality, VR) terminal device, an augmented reality (augmented reality, AR) terminal device, a wireless terminal related to industrial control (industrial control), a wireless terminal related to self-driving (self-driving), a wireless terminal related to remote medical surgery (remote medical surgery), a wireless terminal related to a smart grid (smart grid), a wireless terminal related to transportation safety (transportation safety), a wireless terminal related to a smart city (smart city), a wireless terminal related to a smart home (smart home), or the like. A specific technology and a specific device form used by the terminal device are not limited in the embodiments of this application.

With rapid development of terminal devices, requirements of users on display performance of the terminal devices have gradually increased. To implement an ambient light function of the terminal device, an ambient light sensor is usually provided on the terminal device, and a light ray brightness status of an environment in which the terminal device is currently located is collected by using the ambient light sensor.

Figure 1:
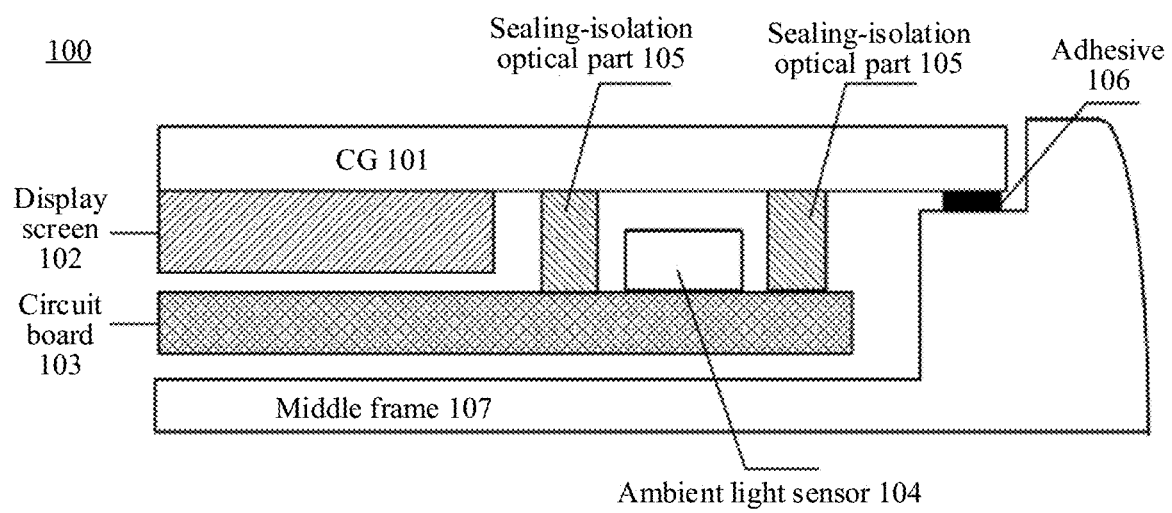
FIG. 1 is a schematic diagram of an internal structure of an existing terminal device with an ambient light detection function.

FIG. 1 is a diagram of an internal structure of an existing terminal device 100 with an ambient light detection function. As shown in FIG. 1, the terminal device 100 includes cover glass (cover glass, CG) 101, a display screen 102, a circuit board 103, an ambient light sensor 104, two sealing-isolation optical parts 105, an adhesive 106, and a middle frame 107. One sealing-isolation optical part 105 is placed between the ambient light sensor 104 and the display screen 102, and configured to isolate light emitted by the display screen 102. The other sealing-isolation optical part 105 is placed between the ambient light sensor 104 and the middle frame 107. The adhesive 106 is configured to connect the CG 101 and the middle frame 107.

To ensure viewing angle performance of the ambient light sensor, in the terminal device 100 shown in FIG. 1, the ambient light sensor 104 and the display screen 102 are placed in isolation. Such a manner has relatively large impact on a screen-to-body ratio of the terminal device.

Therefore, after a display screen with a particular transmittance starts to be used, currently, a commonly used solution is to dispose the ambient light sensor below the display screen of the terminal device (for example, the ambient light sensor 104 in FIG. 1 is placed below the display screen). However, during application of such a solution, the ambient light sensor is affected by brightness of light emitted by display pixels in scenarios of displaying different pictures by the display screen while the ambient light sensor receives actual ambient light brightness of the periphery, resulting in an inaccurate result of detection on the actual ambient light brightness by the ambient light sensor.

In actual verification, it is found that when the foregoing under-screen ambient light solution is used for measurement of peripheral ambient light, on the one hand, when a display area of the terminal device displays solid-color pictures of different colors, and the display screen is under conditions of different brightness, there is completely different impact on the ambient light sensor, and especially under a random mixed picture that appears during actual use by a user, the impact is more complex and changeable, making it difficult to restore the actual ambient light brightness. Therefore, the foregoing algorithm is used to calculate the display area of the display screen to dynamically compensate for light leakage energy sensed by the sensor, and under some complex pictures (for example, under conditions such as video scenes), power consumption caused by the ambient light algorithm also increases. In some scenes (especially dark scenes), accuracy of ambient light compensated by the algorithm also decreases. On the other hand, algorithm models of different display screen manufacturers need to be re-adapted, specifications of the display screen also have impact, different chip platforms support the function differently, and there are some special requirements for the ambient light sensor. Consequently, this solution can be implemented only under some conditions and has stringent technical requirements, with poor performance stability.

In summary, it can be learned that during the measurement of peripheral ambient light by using the under-screen ambient light solution, in order to reduce impact of light emitted by the display screen on the detection result of the ambient light sensor, the ambient light algorithm is used for dynamic compensation to suppress interference from the light emitted by the display screen. However, accuracy of such a method is not high, leading to relatively high power consumption of the terminal device, and there are some special requirements for the ambient light sensor.

In view of this, this application provides a terminal device with an ambient light detection function and an ambient light detection method. The terminal device is provided with at least two photosensitive units arranged at a short distance, and light energy that is of light leakages of the display screen and that is sensed by the at least two photosensitive units arranged at a short distance is basically the same. In addition, transparent black ink is deployed in an area of cover glass CG in a main area within a vertical projection area of one of the two photosensitive units, and opaque ink is deployed in an area of cover glass CG in a main area within a vertical projection area of the other one of the two photosensitive units, making transmittances of the two projection areas significantly different, that is, the photosensitive unit corresponding to the area deployed with the opaque ink can sense light energy of only a part of the peripheral ambient light. In this case, when processing the light energy sensed by the photosensitive units, the terminal device can calculate ambient light brightness based on channel values brought by ambient light obtained by the photosensitive units by using different channel differential methods, to adjust brightness of the display screen of the terminal device.

The embodiments of this application not only effectively suppress the impact of the light emitted by the display screen of the terminal device on the detection result of the photosensitive unit, but also have advantages of simple implementation, easy maintenance, high accuracy, good adaptability, and little dependence on sensor devices. In addition, the embodiments of this application are flexibly applicable to various scenarios, and can effectively suppress the impact of the light emitted by the display screen of the terminal device on the detection result of the photosensitive unit in most scenarios.

In the embodiments of this application, a deployment manner of the ambient light sensor provided in this application is described in detail by using an example in which a plurality of photosensitive units are respectively deployed in different sensors to form a plurality of ambient light sensors.

The deployment manner of the ambient light sensor provided in this application is applicable to various screen types, such as a liquid crystal display (liquid crystal display, LCD) screen, an organic light-emitting diode (organic light-emitting diode, OLED) hard screen, an OLED flexible display, a flexible display, and a low temperature polycrystalline oxide (low temperature polycrystalline oxide, LTPO) screen. The screen type is not limited in this application.

In the embodiments of this application, the deployment manner of the ambient light sensor provided in the embodiments of this application is described in detail by using the OLED flexible display as an example.

The terminal device with an ambient light detection function that is provided in the embodiments of this application is described in detail below with reference to FIG. 2 to FIG. 8 by using an example in which a plurality of ambient light sensors are provided in a slit area.

Figure 2:
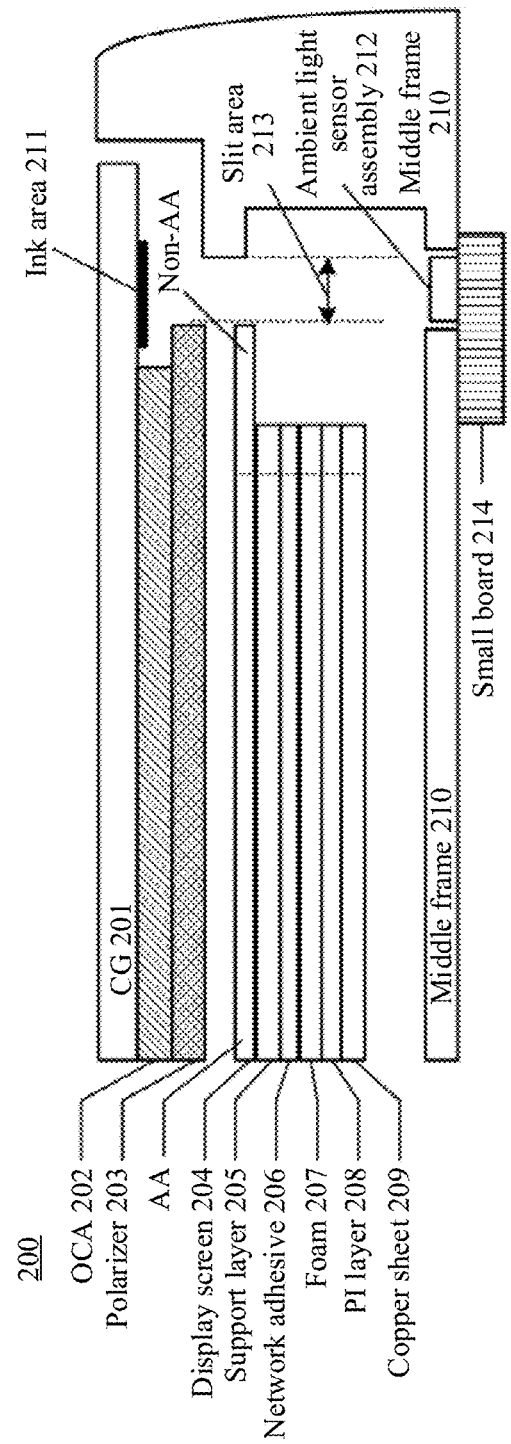
FIG. 2 is a schematic diagram of an internal structure of a terminal device with an ambient light detection function according to an embodiment of this application.

FIG. 2 is a diagram of an internal structure of a terminal device 200 with an ambient light detection function according to an embodiment of this application. FIG. 2 is a cross-sectional view of an internal structure in which cover glass CG 201 of the terminal device 200 is placed upward and horizontally. As shown in FIG. 2, the terminal device 200 may include, from top to bottom, the cover glass CG 201, an optically clear adhesive (optically clear adhesive, OCA) 202, a polarizer 203, a display screen 204, a support layer 205, a network adhesive 206, a foam 207, a polyimide (polyimide, PI) layer 208, a copper sheet 209, a middle frame 210, an ink area 211, and an ambient light sensor assembly 212. The OCA is a special adhesive for bonding transparent optical components (such as lenses), is colorless and transparent, with a transmittance of more than 90% and good bonding strength, and can be cured at room temperature or medium temperature, with small curing shrinkage and other features.

The ambient light sensor assembly 212 is located in a slit area 213 of the terminal device 200 and is deployed above a small board 214. The slit area 213 is an area between a side wall of the display screen 204 and the middle frame 210, and vertical projection of the ambient light sensor assembly located in the area on the cover glass CG 201 is not blocked by another device. The ambient light sensor assembly 212 may include a plurality of ambient light sensors. This is not limited in this application.

It should be understood that, each of the plurality of ambient light sensors in this embodiment of this application includes one photosensitive unit, or each ambient light sensor is one photosensitive unit during actual application. That is, it can be understood that the ambient light sensor assembly may include a plurality of photosensitive units.

The small board 214 is located on a lower surface of the middle frame 210. An area that is of the small board 214 and in which the ambient light sensor assembly 213 is placed is not provided with the middle frame 210, that is, the middle frame 210 exposes the small board 214 through an opening, so that the ambient light sensor assembly 213 located in the slit area can be directly deployed on the small board 214.

The display screen 204 includes an active area (active area, AA) and a non-AA, and the copper sheet is located below the AA and is configured to block light energy of a light leakage in the AA. It should be understood that, as shown in FIG. 2, the copper sheet may alternatively cover a part of the non-AA.

The terminal device with an ambient light detection function that is provided in the embodiments of this application is described in detail below with reference to FIG. 3 to FIG. 5 by using an example in which the ambient light sensor assembly 212 includes two ambient light sensors.

Figure 3:
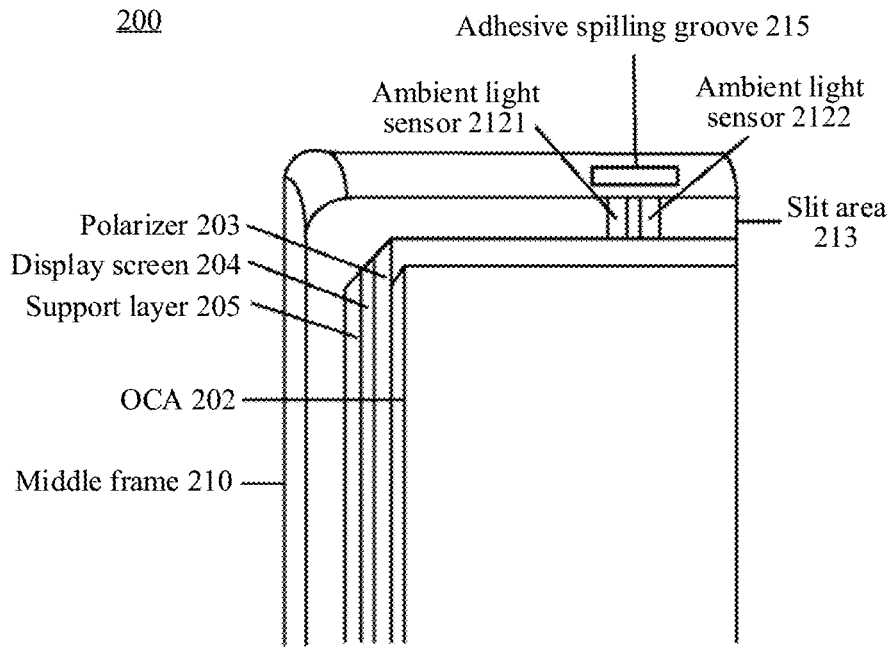
FIG. 3 is a schematic diagram of an internal structure of another terminal device with an ambient light detection function according to an embodiment of this application.

FIG. 3 is a diagram of an internal structure of another terminal device 200 with an ambient light detection function according to an embodiment of this application. FIG. 3 is an internal structure diagram showing that the cover glass CG 201 of the terminal device 200 shown in FIG. 2 is placed rightward and vertically. As shown in FIG. 3, the terminal device 200 may sequentially include, from front to back, the OCA 202, the polarizer 203, the display screen 204, the support layer 205, and the middle frame 210. The slit area 213 is provided with an ambient light sensor 2121 and an ambient light sensor 2122 (that is, the ambient light sensor assembly 212 in FIG. 2). The middle frame 210 is provided with an adhesive spilling groove 215. The adhesive spilling groove 215 can prevent an adhesive between the cover glass CG 201 and the middle frame 210 from being spilt and affecting a photosensitive effect of the ambient light sensor assembly 212 (the ambient light sensor 2121 and the ambient light sensor 2122).

It should be understood that, the internal structure diagram of the terminal device 200 shown in FIG. 3 further includes the network adhesive 206, the foam 207, the PI layer 208, and the copper sheet 209, which are not shown in FIG. 3.

It should be understood that, to facilitate viewing locations of the ambient light sensors and the slit area, the cover glass CG 201 of the terminal device 200 is not shown in the internal structure diagram shown in FIG. 3.

It should be further understood that, string light caused by the side wall of the display screen 204 of the terminal device 200 is not direct, and there are other light-emitting layers inside the structure of the display screen 204, causing the light emitted by the display screen 204 to be refracted and reflected a plurality of times (that is, the light emitted by the display screen 204 is dispersed 360 degrees). The string light may be understood as light obtained by dispersing the light generated by the AA of the display screen to the outside of the display screen through the side wall of the display screen, or may be referred to as a light leakage of the display screen.

Figure 4:
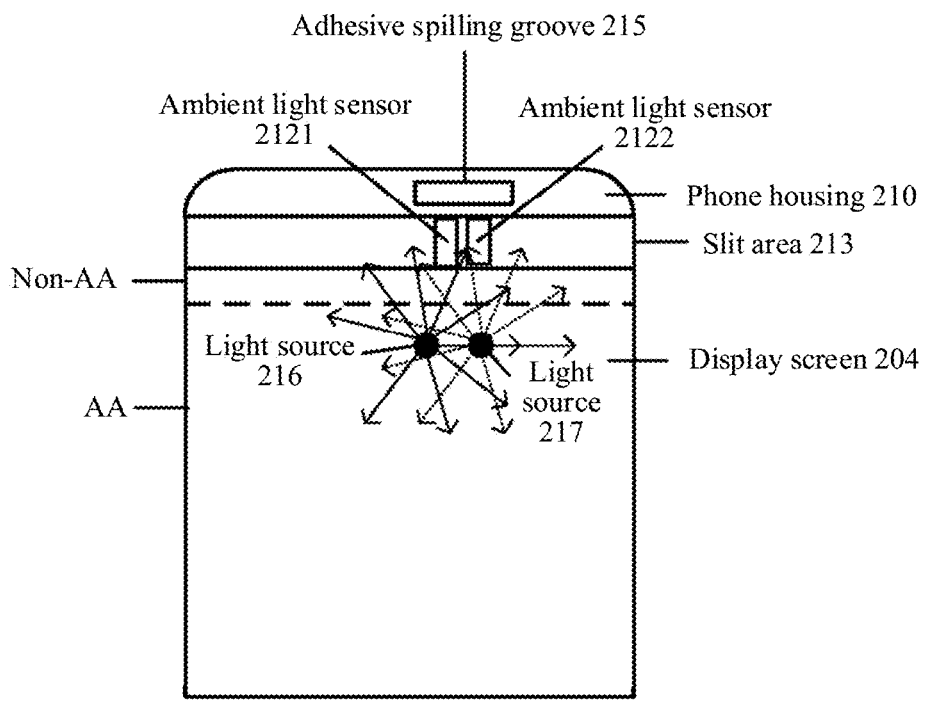
FIG. 4 is a schematic principle diagram of a light leakage of a display screen inside a terminal device according to an embodiment of this application.

FIG. 4 is a schematic principle diagram of a light leakage of a display screen inside a terminal device 200 according to an embodiment of this application. As shown in FIG. 4, the display screen 204 of the terminal device 200 includes two areas: the AA and the non-AA. The AA is an effective display area, and usually refers to a graphical display area, that is, an area that can be detected by the terminal device when a user touches a panel of the terminal device. The non-AA is an area on the display screen 204 other than the AA.

It should be understood that, the AA is actually display content of the display screen 204, and in a process of displaying by the display screen 204, corresponding display pixels emit light to form a picture visible to human eyes. The process of light emission by the display pixels can be equated to a light source, forming light scattering inside the display screen. For example, when the process of light emission by the display pixel is equated to two light sources, light scattering shown in FIG. 4 can be obtained. As shown in FIG. 4, the AA includes two light sources: a light source 216 and a light source 217. Light produced by the two light sources is dispersed in all directions. The slit area 213 of the non-AA includes two ambient light sensors: the ambient light sensor 2121 and the ambient light sensor 2122. The two ambient light sensors can sense energy of light leakages scattered by the light source 216 and the light source 217 to an edge location of the display screen 204 or a light transmission area of the non-AA.

In the scenario shown in FIG. 4, when a distance between the ambient light sensor 2121 and the ambient light sensor 2122 is relatively short, due to impact of wiring of the display screen and a plurality of times of refraction inside the display screen, the two ambient light sensors sense similar energy of light leakages of the display screen through different channels. Therefore, it can be considered that the ambient light sensor 2121 and the ambient light sensor 2122 sense basically the same light energy of light emitted from the AA. In other words, when the distance between the two ambient light sensors is quite short, and the terminal device displays different pictures (for example, the terminal device plays a video or is in a game interface), a difference in light energy that is of light leakages from the side wall of the display screen and that is sensed by the two ambient light sensors at a short distance is relatively small (or light intensity thereof is negligible relative to the external ambient light), that is, the two ambient light sensors sense basically the same light energy of the light leakages of the display screen. In this embodiment of this application, the phenomenon in which the foregoing ambient light sensors sense basically the same light energy of the light leakages of the display screen due to the short-distance arrangement is referred to as a common mode part of dual sensor reception.

It should be understood that, during formation of the foregoing common mode part, a partially symmetrical difference may be caused due to a whole assembly or a tolerance, but the difference may be re-aligned by a calibration process.

For example, the light energy sensed by the ambient light sensor 2121 is denoted as M, the light energy sensed by the ambient light sensor 2122 is denoted as N, and the distance between the ambient light sensor 2121 and the ambient light sensor 2122 is less than or equal to 3 millimeters (millimeter, mm). When the display screen displays different pictures (for example, the terminal device plays a video or is in a game interface), the generated light leakages contribute relatively small to the difference between M and N. In this case, the difference between M and N is extremely small. When N is subtracted from M, it can be expressed as M−N≈0.

With reference to the scenario diagram shown in FIG. 4, the two ambient light sensors need to be arranged at a short distance to ensure that the common mode part of dual sensor reception is formed between the two ambient light sensors.

The ink area 211 is a projection area on the CG 201 and directly above the ambient light sensor assembly 212, and the ink is deployed below the cover glass CG 201.

The ink area 211 includes two different types of inks. One type of ink is transparent black ink, and the other type of ink is opaque ink or low light transmittance ink. In addition, the two types of inks are respectively located in CG areas of vertical projection areas of the ambient light sensor 2121 and the ambient light sensor 2122. For example, the transparent black ink is located in the CG area of the main area within the vertical projection area of the ambient light sensor 2121, and the opaque ink is located in the CG area of the main area within the vertical projection area of the ambient light sensor 2122; or the transparent black ink is located in the CG area of the main area within the vertical projection area of the ambient light sensor 2122, and the opaque ink or the low light transmittance ink is located in the CG area of the main area within the vertical projection area of the ambient light sensor 2121. This is not limited in this embodiment of this application.

For example, the ambient light sensor 2121 in this embodiment of this application includes one photosensitive unit (the photosensitive unit is referred to as a first photosensitive unit in this application), or during actual application, the ambient light sensor 2121 is the first photosensitive unit. The ambient light sensor 2122 in this embodiment of this application includes one photosensitive unit (the photosensitive unit is referred to as a second photosensitive unit in this application), or during actual application, the ambient light sensor 2122 is the second photosensitive unit.

In this embodiment of this application, an area in which the transparent black ink is deployed is referred to as a main path area, and an ambient light sensor corresponding to the main path area may be referred to as a main path sensor. An area in which the opaque ink or the low light transmittance ink is deployed is referred to as an auxiliary path area, and an ambient light sensor corresponding to the auxiliary path area may be referred to as an auxiliary path sensor.

In this embodiment of this application, the transparent black ink and the opaque ink are used as an example for description. It should be understood that, there is a significant difference between transmittances of the transparent black ink and the opaque ink, that is, there is a significant difference between transmittances of visible light bands in the vertical projection areas of the two ambient light sensors. In other words, intensity of the ambient light energy is significant attenuated after the peripheral ambient light passes through the transparent black ink and the opaque ink. However, compared with ambient light energy obtained after passing through the opaque ink, ambient light energy obtained after passing through the transparent black ink has higher intensity. This phenomenon in which ambient light sensors at different locations sense light energy of different intensity due to different peripheral ink transmittances may be referred to as an asymmetric form of actual ambient light at the periphery.

For example, the ambient light sensor 2121 is denoted as a main path sensor, a CG ink area corresponding to the ambient light sensor 2121 is a main path area, and a transmittance thereof is denoted as m. The ambient light sensor 2122 is denoted as an auxiliary path sensor, a CG ink area corresponding to the ambient light sensor 2122 is an auxiliary path area, and a transmittance thereof is denoted as n. In this case, m/n is greater than 3.

The slit area of the terminal device with an ambient light detection function that is provided in the embodiments of this application is provided with two ambient light sensors arranged at a short distance, light energy that is of light leakages of the display screen and that is sensed by the two ambient light sensors arranged at a short distance is basically the same, and two types of inks with different transmittances are respectively deployed in CG areas of main areas within vertical projection areas of the two ambient light sensors, making transmittances of the main areas within the two projection areas significantly different, that is, there is a relatively large difference between light energy of peripheral ambient light sensed by an ambient light sensor corresponding to an area deployed with transparent black ink and light energy of peripheral ambient light sensed by an ambient light sensor corresponding to an area deployed with opaque ink. In this case, when processing the light energy sensed by the ambient light sensors, the terminal device can calculate ambient light brightness based on channel values brought by ambient light obtained by the ambient light sensors by using different channel differential methods, to adjust brightness of the display screen.

It can be understood that, due to asymmetry of the peripheral ambient light caused by a peripheral implementation and approximate symmetry of impact caused by the display screen on the ambient light sensor, strict optical isolation may be or may not need to be performed between photosensitive areas of two ambient light sensors used for a differential asymmetric solution. This is not limited in this application.

Figure 5:
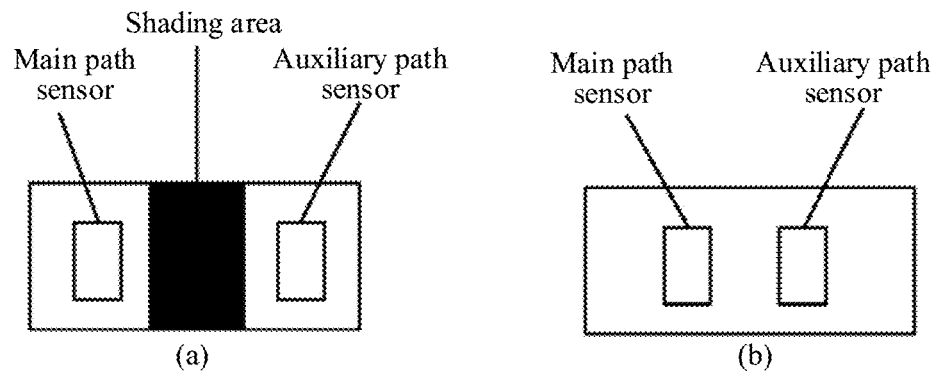
FIG. 5 is a schematic deployment diagram of a shading area according to this application.

A specific location of the optical isolation is shown in (a) of FIG. 5, and a black area between the main path sensor and the auxiliary path sensor is a shading area. The shading area has a particular thickness. As shown in (b) of FIG. 5, no optical isolation is deployed between the main path sensor and the auxiliary path sensor. In other words, the black area in (a) of FIG. 5 may or may not be deployed.

The shading area in this embodiment of this application is made of a non-transparent material, such as black plastic, a black foam, or other opaque materials. This is not limited in this application.

In this embodiment of this application, the deployment of the shading area can further reduce light energy of peripheral ambient light entering the auxiliary path sensor through the transparent ink area, thereby helping improve ambient light detection accuracy of the terminal device.

It should be understood that, the ambient light sensor provided in this embodiment of this application serving as an optical receiver may have a plurality of photosensitive channels, and different wavelengths are sensed on different photosensitive channels. Therefore, the terminal device may calculate, based on a linear transformation formula or another algorithm, dimensionless data (for example, data of RG BC) obtained on each channel by the ambient light sensor, to obtain a piece of illuminance (lux) data, or standard brightness data, and then the terminal device adjusts the brightness of the display screen based on the data. Therefore, the brightness of the display screen of the terminal device with an ambient light detection function that is provided in the embodiments of this application changes according to magnitude of the light energy sensed by the ambient light sensor.

The terminal device with an ambient light detection function that is provided in this embodiment of this application not only effectively suppresses impact of light emitted by the display screen of the terminal device on a detection result of the ambient light sensor, but also have advantages of simple implementation, easy maintenance, high accuracy, good adaptability, and little dependence on sensor devices. In addition, this embodiment of this application is flexibly applicable to various scenarios, and can effectively suppress the impact of the light emitted by the display screen of the terminal device on the detection result of the ambient light sensor in most scenarios. In addition, the ambient light is basically uncoupled from the screen in the solution of this embodiment of this application. Therefore, the solution is not sensitive to specifications such as a screen refresh rate, resolution, brightness consistency, and screen display refresh and has good independence.

In this embodiment of this application, to ensure differential synchronization of display pictures of the terminal device in a rapid changing process, two ambient light sensor are required for synchronous detection, to ensure that collection of external ambient light and screen light leakages by the ambient light sensors is completed simultaneously.

For example, the ambient light sensor assembly 212 is two independent ambient light sensors, and in ensuring the synchronous detection of the two ambient light sensors, it needs to be ensured that a start integral detection instruction is synchronously delivered to the two ambient light sensors. The instruction may be delivered by the terminal device, and data is stored inside the device and then obtained simultaneously. Alternatively, the ambient light sensors may obtain data at different times, but the terminal device needs to obtain, before a next test cycle ends, data stored in registers of the sensors. This is because even if the two independent ambient light sensors obtain data at different times, the data can still be retained inside the ambient light sensors without any change. In this way, the synchronous detection of the ambient light sensors can be ensured, provided that the terminal device obtains the data stored in the registers of the sensors at the same time.

In a possible implementation, the ambient light sensor assembly 212 may be formed by encapsulating two photosensitive units and corresponding circuit parts in one ambient light sensor. The terminal device can synchronize and independently refresh partial data of the two ambient light sensors to the corresponding registers, waiting for a host to obtain the data together to ensure synchronization on hardware. A sensor with such features has two independent sensing units at discrete locations, and the sensing unit has a significantly different appearance from a photosensitive area of a conventional ambient light sensor.

In an optional embodiment, the ink area 211 further includes a third type of ink. The third type of ink is uniform light white ink. The uniform light white ink is deployed under the transparent black ink and the opaque ink.

In this embodiment of this application, the transparent black ink and the opaque ink are referred to as a first ink layer, and the uniform light white ink is referred to as a second ink layer.

Figure 6:
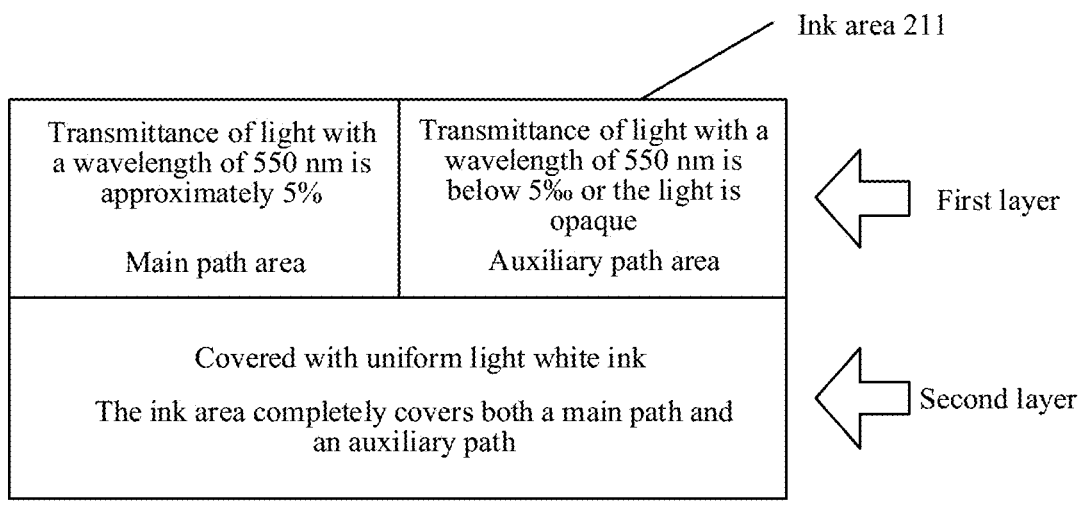
FIG. 6 is a schematic diagram of an ink deployment manner according to an embodiment of this application.

FIG. 6 shows an ink deployment manner according to an embodiment of this application. As shown in FIG. 6, a main path area (deployed with the transparent black ink) of the first ink layer in the ink area 211 under the cover glass CG 201 can cause a transmittance of light with a wavelength of 550 nanometers (nanometer, nm) to be approximately 5%, and an auxiliary path area (deployed with the transparent black ink) can cause the transmittance of the light with the wavelength of 550 nm to be below 5% c or the light to be opaque. The second layer of the uniform light white ink can completely cover the main path area and the auxiliary path area.

It should be understood that, the first ink layer may be one or more layers, and the second ink layer may be one or more layers. This is not limited in this embodiment of this application.

On the one hand, the second layer of the uniform light white ink in this embodiment of this application can increase diffuse reflection of light after string light generated by the side wall of the display screen passes through the uniform light white ink, thereby further reducing a difference between light energy of light leakages of the screen that is sensed by two ambient light sensors at physically different spatial locations, and ensuring that light leakage parts of the screen generate as consistent light leakage impact as possible on the two ambient light sensors. On the other hand, sudden changes in ambient light data due to scenarios in which a light source has an angle with respect to a surface of the display screen of the terminal device can be effectively suppressed, thereby further ensuring stability of the peripheral ambient light sensed by the two ambient light sensors in scenarios of different angles with respect to the light source.

The terminal device with an ambient light detection function that is provided in the embodiments of this application is described in detail below with reference to FIG. 7 and FIG. 8 by using an example in which the ambient light sensor assembly includes three ambient light sensors.

Figure 7:
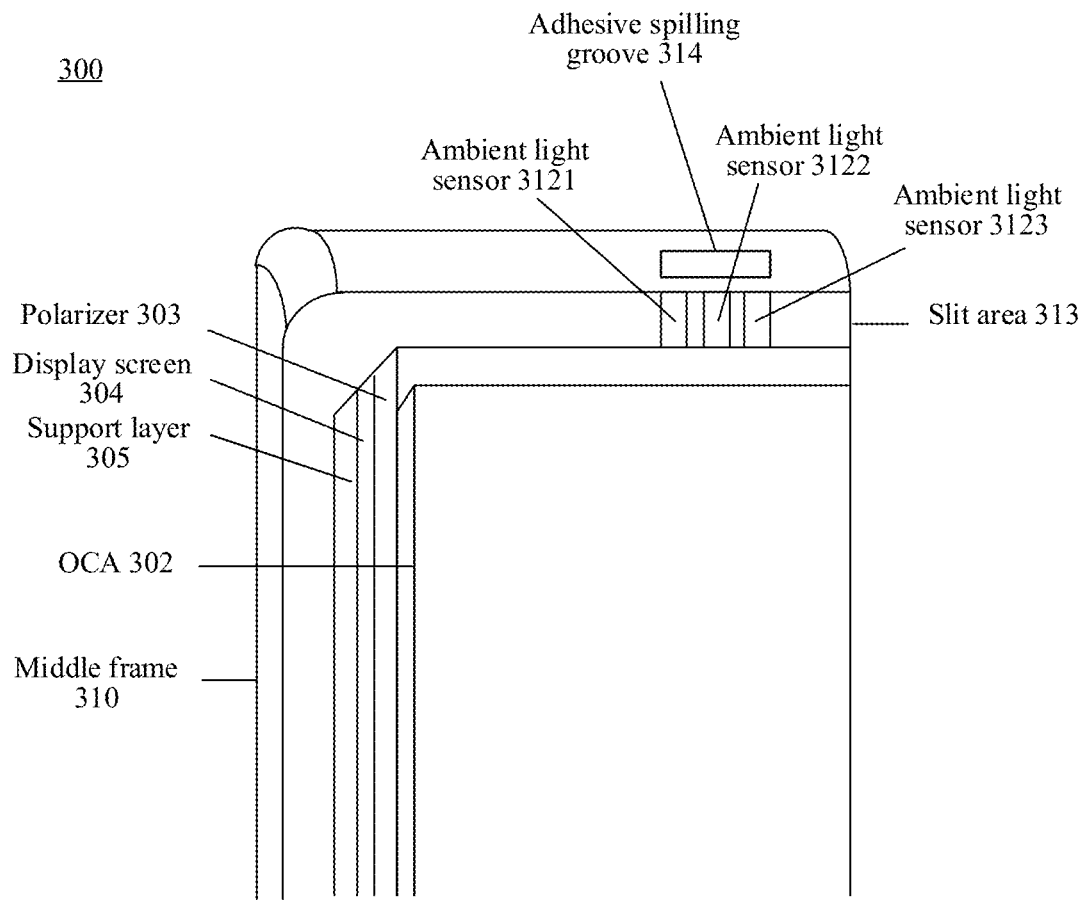
FIG. 7 is a diagram of an internal structure of still another terminal device with an ambient light detection function according to an embodiment of this application.

FIG. 7 is a diagram of an internal structure of still another terminal device 300 with an ambient light detection function according to an embodiment of this application. FIG. 7 is an internal structure diagram showing that cover glass CG 301 of the terminal device 300 is placed rightward and vertically. As shown in FIG. 7, the terminal device 300 sequentially includes, from front to back, an OCA 302, a polarizer 303, a display screen 304, a support layer 305, and a middle frame 310. A slit area 313 is provided with an ambient light sensor 3121, an ambient light sensor 3122, and an ambient light sensor 3123. The middle frame 310 is provided with an adhesive spilling groove 314. The adhesive spilling groove 314 can prevent an adhesive between the cover glass CG 301 and the middle frame 310 from being spilt and affecting a photosensitive effect of the ambient light sensor assembly 312.

For example, the ambient light sensor 3122 includes one photosensitive unit (the photosensitive unit is referred to as a first photosensitive unit in this application), or during actual application, the ambient light sensor 3122 is the first photosensitive unit. The ambient light sensor 3121 includes one photosensitive unit (the photosensitive unit is referred to as a second photosensitive unit in this application), or during actual application, the ambient light sensor 3121 is the second photosensitive unit. The ambient light sensor 3123 includes one photosensitive unit (the photosensitive unit is referred to as a third photosensitive unit in this application), or during actual application, the ambient light sensor 3123 is the third photosensitive unit.

It should be understood that, when the cover glass CG 201 of the terminal device 300 shown in FIG. 7 is placed upward and horizontally, a cross-sectional view of the internal structure of the terminal device 300 is the same as FIG. 2, and therefore is not shown herein again. In addition, the internal structure diagram of the terminal device 300 shown in FIG. 7 further includes a network adhesive 306, a foam 307, a PI layer 308, and a copper sheet 309, which are not shown in FIG. 7.

It should be understood that, to facilitate viewing locations of the ambient light sensors and the slit area, the cover glass CG 301 of the terminal device 300 is not shown in the internal structure diagram shown in FIG. 3.

It should be further understood that, with reference to the schematic principle diagram shown in FIG. 4, when the slit area is provided with a plurality of ambient light sensors, every two of the plurality of ambient light sensors need to be arranged at a short distances to ensure that the common mode part of dual sensor reception is formed between every two of the plurality of ambient light sensors.

Figure 8:
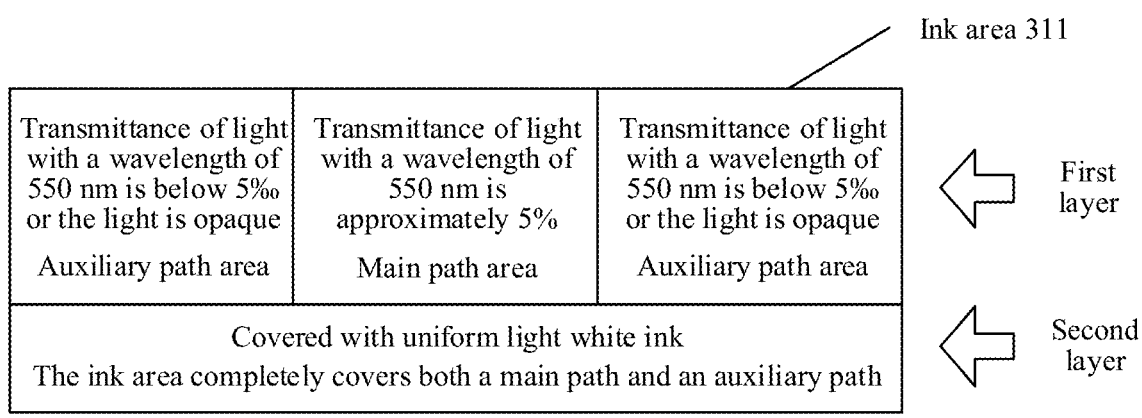
FIG. 8 is a schematic diagram of another ink deployment manner according to an embodiment of this application.

FIG. 8 shows another ink deployment manner according to an embodiment of this application. As shown in FIG. 8, a middle area of the first ink layer deployed in the ink area 211 under the cover glass CG 201 is a main path area (deployed with the transparent black ink) and can cause a transmittance of light with a wavelength of 550 nm to be approximately 5%, and areas on two sides of the middle area of the first ink layer are auxiliary path areas (deployed with the opaque ink) and can cause the transmittance of the light with the wavelength of 550 nm to be below 5‰ or the light to be opaque. The second layer of the uniform light white ink can completely cover the main path area and the two auxiliary path areas.

It should be understood that, the first ink layer may be one or more layers, and the second ink layer may be one or more layers. This is not limited in this application.

For example, an area corresponding to the ambient light sensor 3122 is the main path area, deployed with the transparent black ink, and areas corresponding to the ambient light sensor 3121 and the ambient light sensor 3123 are the auxiliary path areas, deployed with the opaque ink.

A layout manner of the three ambient light sensors allows the ambient light sensor 3122 and the ambient light sensor 3121 to become a differential pair, and the ambient light sensor 3122 and the ambient light sensor 3123 to become a differential pair. During actual work, the two differential pairs respectively output light energy data, the terminal device compares two differential result values, an average value of the two differential pairs or data obtained through combination of other weighting conditions may be finally used, and then a result is calculated according to a given formula, to adjust the brightness of the display screen of the terminal device based on the calculation result.

In this embodiment of this application, three ambient light sensors are deployed to form two differential pairs, so that data fluctuations brought by complex display content of the display screen can be better counteracted.

It should be understood that, a quantity of the ambient light sensors may be further increased to form a plurality of differential pairs. This is not limited in this application. For a layout manner of the plurality of added ambient light sensors, reference may be made to the layout manner of the foregoing three ambient light sensors, and details are not described herein again.

Optionally, in addition to being placed in the slit area, the ambient light sensor assembly can also be placed in the non-AA of the display screen with a particular light transmission capability, and the plurality of ambient light sensors may be arranged left and right or may be arranged up and down. This is not limited in this embodiment of this application.

The terminal device with an ambient light detection function that is provided in the embodiments of this application is described in detail below with reference to FIG. 9 to FIG. 11 by using an example in which a plurality of ambient light sensors are provided in a non-AA with a particular light transmission capability in the terminal device and the plurality of ambient light sensors are arranged left and right.

Figure 9:
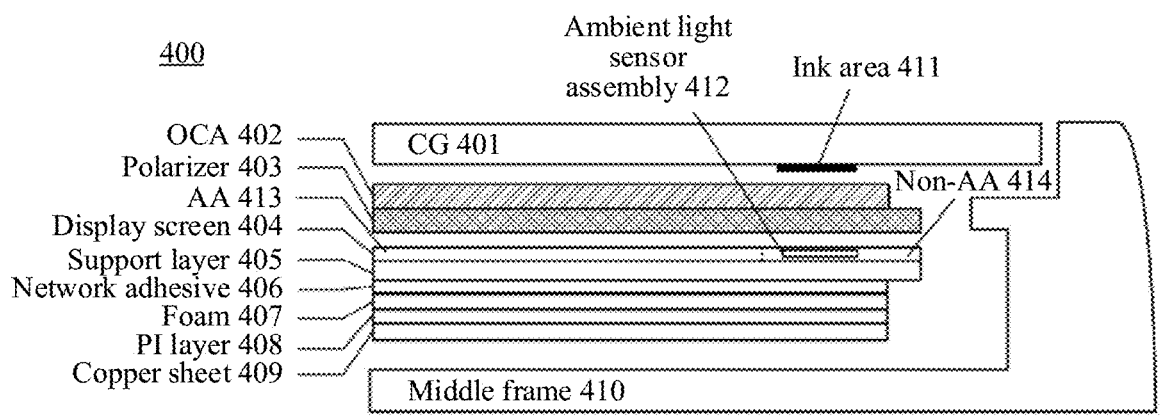
FIG. 9 is a diagram of an internal structure of still another terminal device with an ambient light detection function according to an embodiment of this application.

FIG. 9 is a diagram of an internal structure of still another terminal device 400 with an ambient light detection function according to an embodiment of this application. FIG. 9 is a cross-sectional view of an internal structure in which cover glass CG 401 of the terminal device 400 is placed upward and horizontally. As shown in FIG. 9, the terminal device 400 may sequentially include, from top to bottom, the cover glass CG 401, an ink area 411, an OCA 402, a polarizer 403, an ambient light sensor assembly 412, a display screen 404, a support layer 405, a network adhesive 406, a foam 407, a PI layer 408, a copper sheet 409, and a middle frame 410.

The display screen 404 includes two areas: an AA 413 and a non-AA 414. The AA 413 is an area on a left side of a dashed line. The non-AA 414 is an area on a right side of the dashed line. The ambient light sensor assembly 412 is deployed in the non-AA 414 inside the display screen 404.

For example, when the display screen 404 includes an organic light-emitting diode (organic light-emitting diode, OLED), the ambient light sensor assembly 412 inside the OLED display screen is prepared by using a plasma enhanced chemical vapor deposition (plasma enhanced chemical vapor deposition, PECVD) method, and is located between the OLED in the display screen 404 and a thin film transistor (thin film transistor, TFT). When the display screen 404 includes a micro light-emitting diode (micro LED), an ambient light sensor assembly inside the micro LED display screen is prepared by using a mass translation method, and is located on a same layer as the micro LED device.

It should be understood that, the ambient light sensor assembly 412 is also deployed above or below the non-AA of the display screen 404. When the ambient light sensor assembly 412 is located above the display screen, the polarizer 403 may cover the ambient light sensor assembly 412 or may not cover the ambient light sensor assembly 412. The ink area 411 is a projection area directly above the ambient light sensor assembly 412 and is deployed below an area of the cover glass CG 401.

In an optional embodiment, the foregoing ambient light sensor assembly 412 includes two ambient light sensors: an ambient light sensor 4121 and an ambient light sensor 4122.

It should be understood that, the ambient light sensor 4121 and/or the ambient light sensor 4122 may be a sensing circuit chip or a chip analog front end of differential ambient light.

Figure 10:
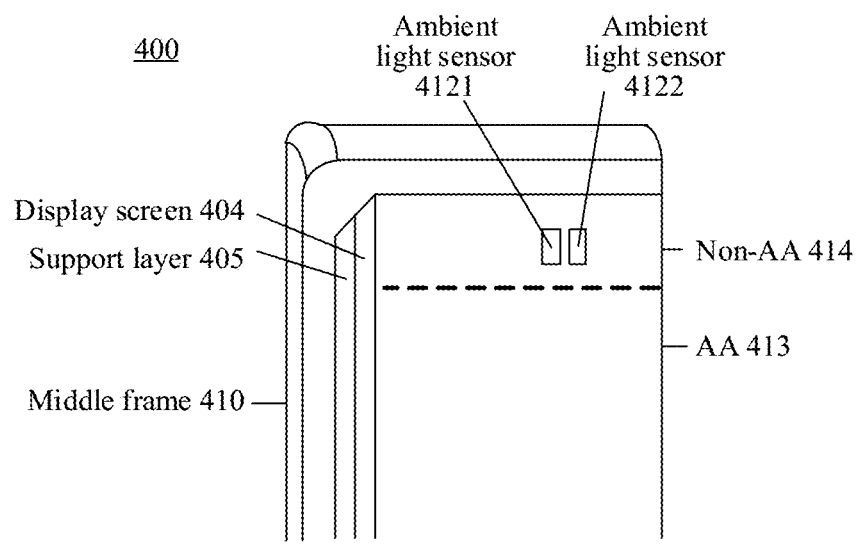
FIG. 10 is a diagram of an internal structure of still another terminal device with an ambient light detection function according to an embodiment of this application.

FIG. 10 is a diagram of an internal structure of still another terminal device 400 with an ambient light detection function according to an embodiment of this application. FIG. 10 is an internal structure diagram showing that the cover glass CG 401 of the terminal device 400 shown in FIG. 9 is placed rightward and vertically. As shown in FIG. 10, the terminal device 400 may sequentially include, from front to back, an ambient light sensor 4121, an ambient light sensor 4122, the display screen 404, the support layer 405, and the middle frame 410. The ambient light sensor 4121 and the ambient light sensor 4122 are located in the non-AA 414 inside the display screen 404 and are arranged side by side in a left-to-right direction (that is, the ambient light sensor 4122 is on a right side of the ambient light sensor 4121).

It should be understood that, the internal structure diagram of the terminal device 400 shown in FIG. 10 further includes: the OCA 402, the polarizer 403, the network adhesive 406, the foam 407, the PI layer 408, and the copper sheet 409, which are not shown in FIG. 10.

It should be further understood that, to facilitate viewing locations of the ambient light sensors and a slit area, the cover glass CG 401 of the terminal device 400 is not shown in the internal structure diagram shown in FIG. 10.

The ambient light sensor 4121 is a main path sensor. The ambient light sensor 4122 is an auxiliary path sensor. Correspondingly, ink deployed in the area of the cover glass CG 401 can block peripheral incoming light of the ambient light sensor 4122 and expose peripheral incoming light of the ambient light sensor 4121, that is, one or more layers of transparent black ink are deployed in an area of the cover glass CG 201 corresponding to the ambient light sensor 4121, and one or more layers of opaque ink are deployed in an area of the cover glass CG 401 corresponding to the ambient light sensor 4122.

Optionally, the transparent black ink and the opaque ink deployed in the areas of the cover glass CG 401 may further cover one or more layers of uniform light white ink.

It should be understood that, the ambient light sensor 4122 may alternatively be on a right side of the ambient light sensor 4121, or the ambient light sensor 4121 and the ambient light sensor 4122 are arranged up and down. This is not limited in this application.

In an optional embodiment, the foregoing ambient light sensor assembly 412 includes three ambient light sensors: an ambient light sensor 5121, an ambient light sensor 5122, and an ambient light sensor 5123.

In this embodiment of this application, the three deployed ambient light sensors can form two differential pairs, so that fluctuations of ambient light data brought by complex display content of the display screen can be better counteracted.

Figure 11:
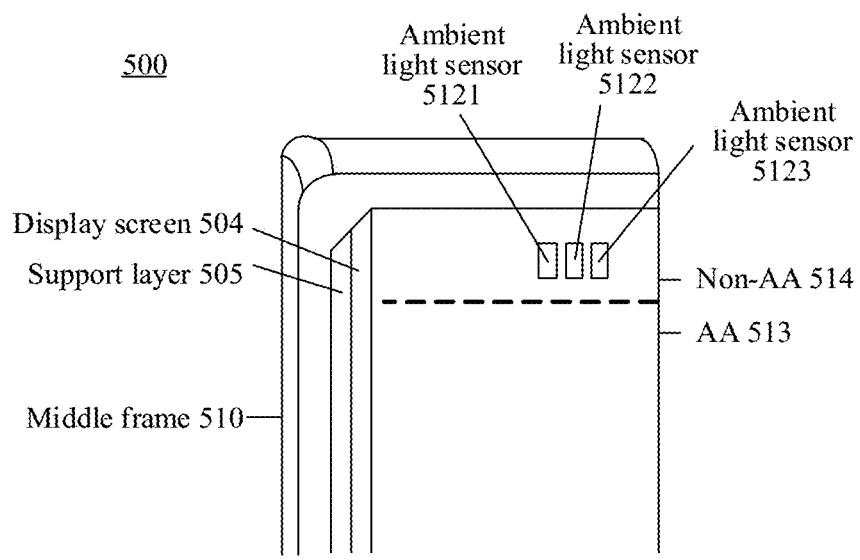
FIG. 11 is a diagram of an internal structure of still another terminal device with an ambient light detection function according to an embodiment of this application.

FIG. 11 is a diagram of an internal structure of still another terminal device 500 with an ambient light detection function according to an embodiment of this application. FIG. 11 is an internal structure diagram showing that cover glass CG 501 of the terminal device 500 is placed rightward and vertically. As shown in FIG. 11, the terminal device 500 sequentially includes, from front to back, an ambient light sensor 5121, an ambient light sensor 5122, an ambient light sensor 5123, a display screen 504, a support layer 505, and a middle frame 510. The ambient light sensor 5121, the ambient light sensor 5122, and the ambient light sensor 5123 are located in a non-AA 514 inside the display screen 504 and are arranged side by side in a left-to-right direction (that is, the ambient light sensor 5122 is located on a left side of the ambient light sensor 5121, and the ambient light sensor 5123 is located on a right side of the ambient light sensor 5121).

It should be understood that, when the cover glass CG 501 of the terminal device 500 shown in FIG. 11 is placed upward and horizontally, a cross-sectional view of the internal structure of the terminal device 500 is the same as FIG. 9, and therefore is not shown herein again. In addition, the internal structure diagram of the terminal device 500 shown in FIG. 11 further includes an OCA 502, a polarizer 503, a network adhesive 506, a foam 507, a PI layer 508, and a copper sheet 509, which are not shown in FIG. 11.

It should be understood that, to facilitate viewing locations of the ambient light sensors and a slit area, the cover glass CG 501 of the terminal device 500 is not shown in the internal structure diagram shown in FIG. 11.

It should be further understood that, for ink deployment manners corresponding to the three ambient light sensors, reference may be made to the related descriptions of the ink deployment manners corresponding to the three sensors in the slit area, and details are not described herein again.

The terminal device with an ambient light detection function that is provided in the embodiments of this application is described in detail below with reference to FIG. 12 to FIG. 15 by using an example in which a plurality of ambient light sensors are provided in a non-AA with a particular light transmission capability in the terminal device and the plurality of ambient light sensors are arranged up and down.

Figure 12:
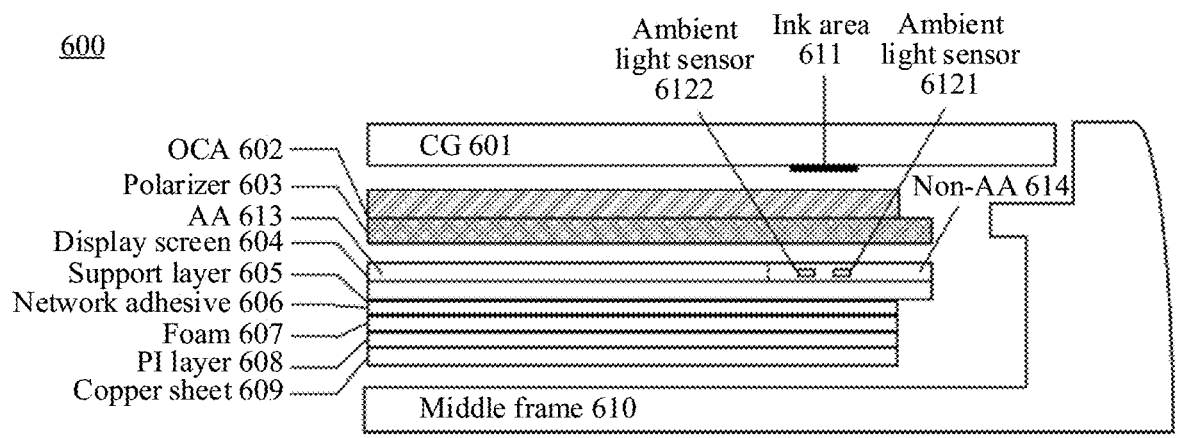
FIG. 12 is a diagram of an internal structure of still another terminal device with an ambient light detection function according to an embodiment of this application.

FIG. 12 is a diagram of an internal structure of still another terminal device 600 with an ambient light detection function according to an embodiment of this application. FIG. 12 is a cross-sectional view of an internal structure in which cover glass CG 601 of the terminal device 600 is placed upward and horizontally. As shown in FIG. 12, the terminal device 600 may sequentially include, from top to bottom, the cover glass CG 601, an ink area 611, an ambient light sensor 6121, an ambient light sensor 6122, an OCA 602, a polarizer 603, a display screen 604, a support layer 605, a network adhesive 606, a foam 607, a PI layer 608, a copper sheet 609, and a middle frame 610.

Figure 13:
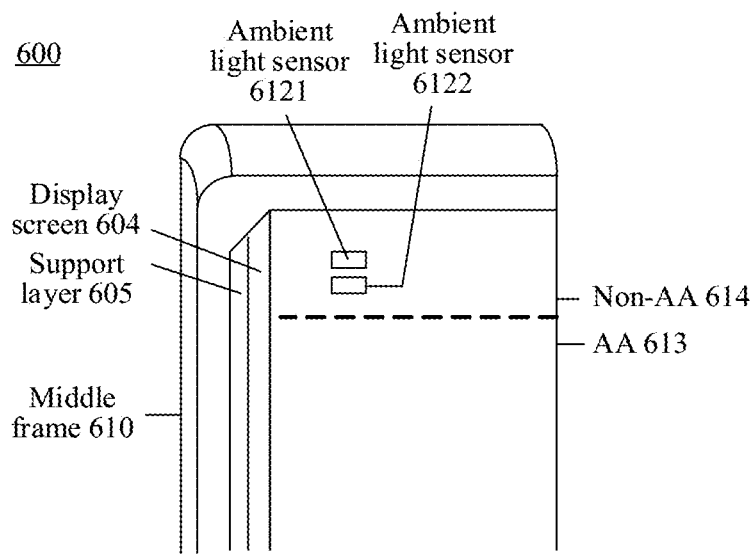
FIG. 13 is a diagram of an internal structure of still another terminal device with an ambient light detection function according to an embodiment of this application.

FIG. 13 is a diagram of an internal structure of still another terminal device 600 with an ambient light detection function according to an embodiment of this application. FIG. 13 is an internal structure diagram showing that an area of the cover glass CG 601 of the terminal device 600 shown in FIG. 12 is placed rightward and vertically. As shown in FIG. 13, the terminal device 600 may sequentially include, from front to back, the ambient light sensor 6121, the ambient light sensor 6122, the display screen 604, the support layer 605, and the middle frame 610. The ambient light sensor 6121 and the ambient light sensor 6122 are located in the non-AA 614 inside the display screen 604 and are arranged up and down (that is, the ambient light sensor 6121 is above the ambient light sensor 6122).

It should be understood that, for ink deployment manners corresponding to the two ambient light sensors (the ambient light sensor 6121 and the ambient light sensor 6122), reference may be made to the related descriptions of the ink deployment manners corresponding to the two ambient light sensors arranged side by side in a left-to-right direction, and details are not described herein again.

Figure 14:
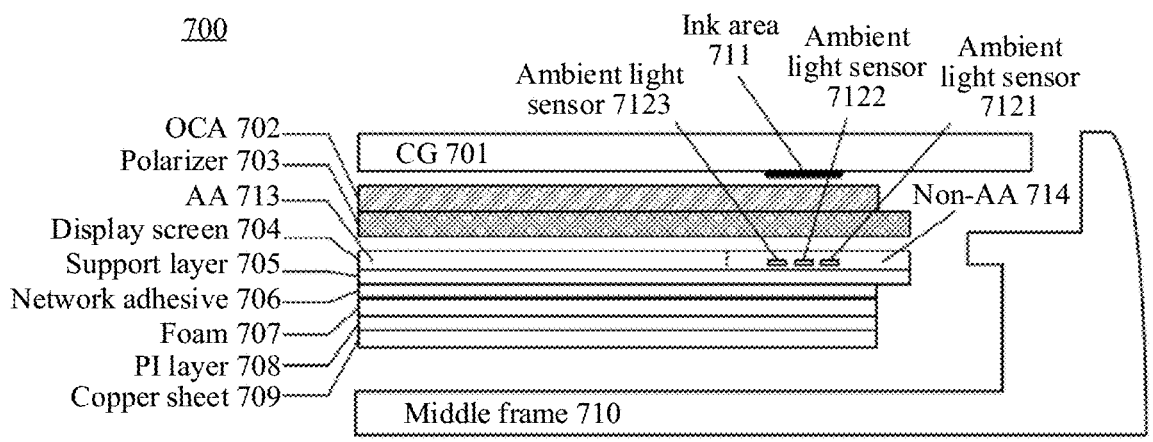
FIG. 14 is a diagram of an internal structure of still another terminal device with an ambient light detection function according to an embodiment of this application.

FIG. 14 is a diagram of an internal structure of still another terminal device 700 with an ambient light detection function according to an embodiment of this application. The structure diagram shown in FIG. 14 is basically the same as the structure diagram shown in FIG. 12, and reference can be made to the related description of FIG. 12. Details are not described herein again. A difference between FIG. 14 and FIG. 12 lies in that: an ambient light sensor 7121, an ambient light sensor 7122, and an ambient light sensor 7123 are included between a CG 701 and an OCA 702.

Figure 15:
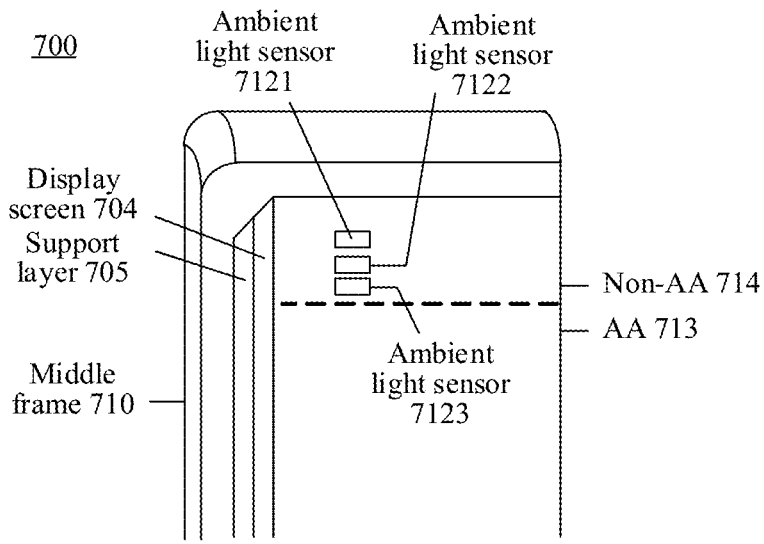
FIG. 15 is a diagram of an internal structure of still another terminal device with an ambient light detection function according to an embodiment of this application.

FIG. 15 is a diagram of an internal structure of still another terminal device 700 with an ambient light detection function according to an embodiment of this application. FIG. 15 is an internal structure diagram showing that the cover glass CG 701 of the terminal device 700 shown in FIG. 14 is placed rightward and vertically. As shown in FIG. 15, the terminal device 700 may sequentially include, from front to back, the ambient light sensor 7121, the ambient light sensor 7122, the ambient light sensor 7123, a display screen 704, a support layer 705, and a middle frame 710. The ambient light sensor 7121, the ambient light sensor 7122, and the ambient light sensor 7123 are located in a non-AA 714 inside the display screen 704 and are arranged up and down (that is, the ambient light sensor 7121 is located above the ambient light sensor 7122, and the ambient light sensor 7123 is located below the ambient light sensor 7122).

It should be understood that, for ink deployment manners corresponding to the three ambient light sensors arranged up and down, reference may be made to the related descriptions of the ink deployment manners corresponding to the three ambient light sensors in the slit area, and details are not described herein again.

Optionally, the plurality of ambient light sensors may alternatively be placed in a non-AA or a non-slit area with a particular light transmission capability, but the plurality of ambient light sensors are located under the projection area of the display screen, for example, the non-AA, the support layer under the non-slit area, the network adhesive layer, the foam layer, or other areas with a particular light transmission capability shown in FIG. 2.

It should be understood that, if the quantity of ambient light sensors continues to be increased, for both the layout of the plurality of ambient light sensors and corresponding ink deployment manners, reference may be made to the related description of the foregoing three ambient light sensors, and details are not described herein again.

Optionally, proximity light receiving sensors may be further provided around the foregoing ambient light sensor assembly, so that functional integration can be achieved.

Figure 16:
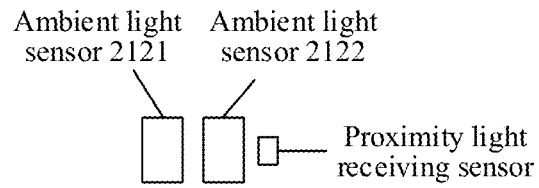
FIG. 16 is a schematic diagram of relative locations of a proximity light receiving sensor and an ambient light sensor according to an embodiment of this application.
Figure 17:
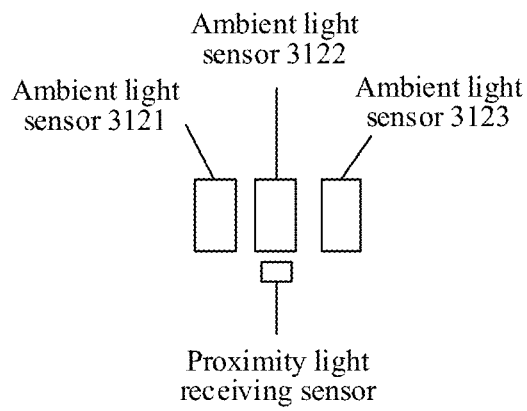
FIG. 17 is a schematic diagram of relative locations of another proximity light receiving sensor and an ambient light sensor according to an embodiment of this application.

FIG. 16 and FIG. 17 respectively show relative locations of two proximity light receiving sensors and another sensor. A proximity light receiving sensor is added to FIG. 16 on the basis of the terminal device 200 shown in FIG. 3. As shown in FIG. 16, it is assumed that the ambient light sensor 2122 in the two ambient light sensors is a main sensor, and an optical proximity sensor is provided on a right side of the ambient light sensor 2122. A proximity light receiving sensor is added to FIG. 17 on the basis of the terminal device 300 shown in FIG. 7. As shown in FIG. 17, it is assumed that the ambient light sensor 3122 in the three ambient light sensors is a main sensor, and a proximity light receiving sensor is provided directly below the ambient light sensor 3122.

It should be understood that, the proximity light receiving sensor may be disposed at any location around the main sensor, for example, on a left side of, on a right side of, above, or below the main sensor. This is not limited in this embodiment of this application. It should be further understood that, FIG. 16 and FIG. 17 are described only by using the terminal device 200 and the terminal device 300 as examples. In other terminal devices (for example, the terminal device 400 to the terminal device 700) of the embodiments of this application, the foregoing solution is also applicable, and examples are not described one by one herein.

An embodiment of this application further provides an ambient light detection method. In this method, first light energy is obtained through a first photosensitive unit in at least two photosensitive units, second light energy is obtained through a second photosensitive unit in the at least two photosensitive units, and the obtained first light energy is greater than the second light energy. In this way, light energy of a light leakage of a display screen can be removed based on the obtained different light energy by using a differential processing method, to obtain true brightness of peripheral ambient light to adjust brightness of the display screen. The method helps improve ambient light detection accuracy of a terminal device and has good adaptability and low costs.

It should be understood that, the ambient light detection method may be applied to a terminal device that includes cover glass, a display screen, an ambient light sensor assembly, and a middle frame and that has an ambient light detection function. The ambient light sensor includes at least two photosensitive units. The display screen includes an active area AA and a non-AA. Transparent black ink is deployed in a vertical projection area of a photosensitive area of the first photosensitive unit on the cover glass. Opaque ink or low light transmittance ink is deployed in a vertical projection area of a photosensitive area of the second photosensitive unit on the cover glass. The ambient light detection method may include the following steps:

Step 1: Sense, by using the first photosensitive unit in the at least two photosensitive units, light energy of peripheral ambient light that is of the terminal device and that passes through the transparent black ink and light energy of a light leakage of the display screen to obtain first light energy, where the light leakage of the display screen is light leaked from the non-AA by light generated by a light-emitting unit when the AA displays an image.

Step 2: Sense, by using the second photosensitive unit in the at least two photosensitive units, light energy of peripheral ambient light that is of the terminal device and that passes through the opaque ink or the low light transmittance ink, partial peripheral ambient light energy that passes through the transparent black ink, and the light energy of the light leakage of the display screen to obtain second light energy, where the first light energy is greater than the second light energy.

Step 3: Remove, based on the first light energy and the second light energy by using a differential processing method, the light energy of the light leakage generated by the display screen during content display, to obtain true brightness of the peripheral ambient light to adjust brightness of the display screen.

In an optional embodiment, the cover glass includes uniform light white ink, and the method further includes: increasing diffusion of the light leakage of the display screen and the peripheral ambient light by using the uniform light white ink. The sensing, by using the first photosensitive unit in the at least two photosensitive units, light energy of peripheral ambient light that is of the terminal device and that passes through the transparent black ink and light energy of a light leakage of the display screen to obtain first light energy includes: sensing, by using the first photosensitive unit, light energy of peripheral ambient light that is of the terminal device and that passes through the transparent black ink and the uniform light white ink and the light energy of the light leakage of the display screen, to obtain third light energy. The sensing, by using the second photosensitive unit in the at least two photosensitive units, light energy of peripheral ambient light that is of the terminal device and that passes through the opaque ink or the low light transmittance ink, partial peripheral ambient light energy that passes through the transparent black ink, and the light energy of the light leakage of the display screen to obtain second light energy includes: sensing, by using the second photosensitive unit, light energy of peripheral ambient light that is of the terminal device and that passes through the opaque ink and the uniform light white ink or that passes through the low light transmittance ink and the uniform light white ink, light energy of partial peripheral ambient light that passes through the transparent black ink and the uniform light white ink, and the light energy of the light leakage of the display screen, to obtain fourth light energy, where the third light energy is greater than the fourth light energy. The removing, based on the first light energy and the second light energy by using a differential processing method, the light energy of the light leakage generated by the display screen during content display, to obtain true brightness of the peripheral ambient light to adjust brightness of the display screen includes: removing, based on the third light energy and the fourth light energy by using the differential processing method, the light energy of the light leakage generated by the display screen during the content display, to obtain the true brightness of the peripheral ambient light to adjust the brightness of the display screen.

In an optional embodiment, the method further includes: sensing, by using a third photosensitive unit in the at least two photosensitive units, light energy of peripheral ambient light that is of the terminal device and that passes through the opaque ink or the low light transmittance ink, peripheral ambient light energy that passes through the transparent black ink, and the light energy of the light leakage of the display screen to obtain fifth light energy, where the first light energy is greater than the fifth light energy. The removing, based on the first light energy and the second light energy by using a differential processing method, the light energy of the light leakage generated by the display screen during content display, to obtain true brightness of the peripheral ambient light to adjust brightness of the display screen includes: calculating brightness of first peripheral ambient light based on the first ambient light energy and the second ambient light energy; calculating brightness of second peripheral ambient light based on the first light energy and the fifth light energy; and calculating an average value of the brightness of the first peripheral ambient light and the brightness of the second peripheral ambient light to adjust the brightness of the display screen.

In an optional embodiment, when a wavelength of the foregoing peripheral ambient light is 550 nanometers, a light transmittance of the transparent black ink is 5%, and a light transmittance of the opaque ink or the low light transmittance ink is less than 5‰.

In the description of this application, it should be understood that orientation or position relationships indicated by the terms such as "upper", "lower", "front", "rear", "left", "right", "top", "bottom", "inside", and "outer" are based on orientation or position relationships shown in the accompanying drawings, and are used only for ease and brevity of illustration and description of this application, rather than indicating or implying that the mentioned apparatus or component need to have a particular orientation or need to be constructed and operated in a particular orientation. Therefore, such terms should not be construed as limiting of this application.

In the embodiments of this application, unless otherwise explicitly specified or defined, the terms such as "mount", "install", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. A person of ordinary skill in the art can understand specific meanings of the foregoing terms in this application according to a specific situation.

In the specification, claims, and accompanying drawings of the embodiments of this application, the terms "first", "second", "third", and so on are intended to distinguish between similar objects but do not necessarily indicate a specific order or sequence. It may be understood that the data used in such a way is interchangeable in proper circumstances, so that the embodiments of this application described herein can be implemented in other sequences than the sequence illustrated or described herein. Moreover, the terms "may include", "have", and any other variants mean to cover the non-exclusive inclusion, for example, a process, method, system, product, or device that includes a list of steps or units is not necessarily limited to those units, but may include other units not expressly listed or inherent to such a process, method, system, product, or device.

The foregoing embodiments are merely intended for describing the technical solutions of the embodiments of this application other than limiting this application. Although the embodiments of this application is described in detail with reference to the foregoing embodiments, a person of ordinary skill in the art should understand that they may still make modifications to the technical solutions described in the foregoing embodiments or make equivalent replacements to some technical features thereof, without departing from the scope of the technical solutions of the embodiments of this application.

What is claimed is:

1. A terminal device with an ambient light detection function, comprising:
   cover glass, a display screen, an ambient light sensor assembly, and a middle frame, wherein
   the display screen is located below the cover glass, the middle frame is located below the display screen and around the display screen, the middle frame and a side wall of the display screen form a slit area, the display screen comprises an active area AA and a non-AA, and the ambient light sensor assembly is located in the slit area, or the ambient light sensor assembly is located in the non-AA of the display screen;
   the ambient light sensor assembly comprises at least two photosensitive units, and a distance between a first photosensitive unit and a second photosensitive unit in the at least two photosensitive units is less than or equal to a preset threshold; and
   transparent black ink is deployed in a vertical projection area of a photosensitive area of the first photosensitive unit on the cover glass, and opaque ink or low light transmittance ink is deployed in a vertical projection area of a photosensitive area of the second photosensitive unit on the cover glass.

2. The terminal device according to claim 1, wherein the first photosensitive unit is configured to:
   sense light energy of peripheral ambient light that is of the terminal device and that passes through the transparent black ink and light energy of a light leakage of the display screen to obtain first light energy, wherein the light leakage of the display screen is light leaked from the non-AA by light generated by a light-emitting unit when the AA displays an image; and
   the second photosensitive unit is configured to:
   sense light energy of peripheral ambient light that is of the terminal device and that passes through the opaque ink or the low light transmittance ink, partial peripheral ambient light energy that passes through the transparent black ink, and the light energy of the light leakage of the display screen to obtain second light energy, wherein the first light energy is greater than the second light energy.

3. The terminal device according to claim 2, wherein the terminal device further comprises:
   a processor, wherein
   the processor is configured to remove the light energy of the light leakage of the display screen based on the first light energy and the second light energy by using a differential processing method, to obtain true brightness of the peripheral ambient light to adjust brightness of the display screen.

4. The terminal device according to claim 1, wherein the terminal device further comprises:
   a small board, wherein
   the small board is located on a lower surface of the middle frame away from the display screen; and
   the ambient light sensor assembly is located at a vertical projection location of the slit area on the small board.

5. The terminal device according to claim 1, wherein the terminal device further comprises:
   a copper sheet or a black foam, wherein
   the copper sheet or the black foam is located below the AA of the display screen.

6. The terminal device according to claim 1, wherein in a case that the ambient light sensor assembly is located in the slit area, the second photosensitive unit and the first photosensitive unit are arranged side by side along a length direction of the slit area.

7. The terminal device according to claim 1, wherein in a case that the ambient light sensor assembly is located in the non-AA of the display screen, the second photosensitive unit is located on any side around the first photosensitive unit.

8. The terminal device according to claim 1, wherein the cover glass further comprises:
   uniform light white ink, wherein
   the uniform light white ink covers the transparent black ink and the opaque ink.

9. The terminal device according to claim 8, wherein the uniform light white ink is configured to:
   increase diffusion of the light leakage of the display screen and the peripheral ambient light;
   the first photosensitive unit is further configured to sense light energy of peripheral ambient light that is of the terminal device and that passes through the transparent black ink and the uniform light white ink and the light energy of the light leakage of the display screen, to obtain third light energy; and
   the second photosensitive unit is further configured to sense light energy of peripheral ambient light that is of the terminal device and that passes through the opaque ink and the uniform light white ink or that passes through the low light transmittance ink and the uniform light white ink, light energy of partial peripheral ambient light that passes through the transparent black ink and the uniform light white ink, and the light energy of the light leakage of the display screen, to obtain fourth light energy, wherein the third light energy is greater than the fourth light energy.

10. The terminal device according to claim 9, wherein the processor is further configured to:
    remove the light energy of the light leakage of the display screen based on the third light energy and the fourth light energy by using the differential processing method, to obtain the true brightness of the peripheral ambient light to adjust the brightness of the display screen.

11. The terminal device according to claim 1, wherein the first photosensitive unit is located between the second photosensitive unit and a third photosensitive unit in the at least two photosensitive units;
    a distance between the first photosensitive unit and the second photosensitive unit is less than or equal to the preset threshold, and a distance between the first photosensitive unit and the third photosensitive unit is less than or equal to the preset threshold; and
    opaque ink or low light transmittance ink is deployed in a vertical projection area of a photosensitive area of the third photosensitive unit on the cover glass.

12. The terminal device according to claim 11, wherein the third photosensitive unit is configured to:
    sense light energy of peripheral ambient light that is of the terminal device and that passes through the opaque ink or the low light transmittance ink, peripheral ambient light energy that passes through the transparent black ink, and the light energy of the light leakage of the display screen to obtain fifth light energy, wherein the first light energy is greater than the fifth light energy.

13. The terminal device according to claim 12, wherein the processor is further configured to:

calculate brightness of first peripheral ambient light based on the first ambient light energy and the second ambient light energy; calculate brightness of second peripheral ambient light based on the first light energy and the fifth light energy; and calculate an average value of the brightness of the first peripheral ambient light and the brightness of the second peripheral ambient light to adjust the brightness of the display screen.

14. The terminal device according to claim 1, wherein the terminal device further comprises:

a proximity light receiving sensor, wherein the proximity light receiving sensor is located on any side around the ambient light sensor assembly; and the proximity light receiving sensor is configured to sense proximity light.

15. The terminal device according to claim 1, wherein in a case that a wavelength of the peripheral ambient light is 550 nanometers, a light transmittance of the transparent black ink is 5%, and a light transmittance of the opaque ink or the low light transmittance ink is less than 5‰.

16. The terminal device according to claim 1, wherein the middle frame comprises:

an adhesive spilling groove, wherein the adhesive spilling groove is configured to carry an adhesive spilt between the cover glass and the middle frame.

17. An ambient light detection method, applied to a terminal device that comprises cover glass, a display screen, an ambient light sensor assembly, and a middle frame and that has an ambient light detection function, wherein the ambient light sensor comprises at least two photosensitive units, the display screen comprises an active area AA and a non-AA, transparent black ink is deployed in a vertical projection area of a photosensitive area of the first photosensitive unit on the cover glass, opaque ink or low light transmittance ink is deployed in a vertical projection area of a photosensitive area of the second photosensitive unit on the cover glass, and the method comprises:

sensing, by the first photosensitive unit in the at least two photosensitive units, light energy of peripheral ambient light that is of the terminal device and that passes through the transparent black ink and light energy of a light leakage of the display screen to obtain first light energy, wherein the light leakage of the display screen is light leaked from the non-AA by light generated by a light-emitting unit when the AA displays an image;

sensing, by the second photosensitive unit in the at least two photosensitive units, light energy of peripheral ambient light that is of the terminal device and that passes through the opaque ink or the low light transmittance ink, partial peripheral ambient light energy that passes through the transparent black ink, and the light energy of the light leakage of the display screen to obtain second light energy, wherein the first light energy is greater than the second light energy; and removing, based on the first light energy and the second light energy by using a differential processing method, the light energy of the light leakage generated by the display screen during content display, to obtain true brightness of the peripheral ambient light to adjust brightness of the display screen.

18. The method according to claim 17, wherein the cover glass comprises uniform light white ink, and the method further comprises:

increasing diffusion of the light leakage of the display screen and the peripheral ambient light by using the uniform light white ink;

the sensing, by the first photosensitive unit in the at least two photosensitive units, light energy of peripheral ambient light that is of the terminal device and that passes through the transparent black ink and light energy of a light leakage of the display screen to obtain first light energy comprises:

sensing, by the first photosensitive unit, light energy of peripheral ambient light that is of the terminal device and that passes through the transparent black ink and the uniform light white ink and the light energy of the light leakage of the display screen, to obtain third light energy;

the sensing, by the second photosensitive unit in the at least two photosensitive units, light energy of peripheral ambient light that is of the terminal device and that passes through the opaque ink or the low light transmittance ink, partial peripheral ambient light energy that passes through the transparent black ink, and the light energy of the light leakage of the display screen to obtain second light energy comprises:

sensing, by the second photosensitive unit, light energy of peripheral ambient light that is of the terminal device and that passes through the opaque ink and the uniform light white ink or that passes through the low light transmittance ink and the uniform light white ink, light energy of partial peripheral ambient light that passes through the transparent black ink and the uniform light white ink, and the light energy of the light leakage of the display screen, to obtain fourth light energy, wherein the third light energy is greater than the fourth light energy; and the removing, based on the first light energy and the second light energy by using a differential processing method, the light energy of the light leakage generated by the display screen during content display, to obtain true brightness of the peripheral ambient light to adjust brightness of the display screen comprises:

removing, based on the third light energy and the fourth light energy by using the differential processing method, the light energy of the light leakage generated by the display screen during the content display, to obtain the true brightness of the peripheral ambient light to adjust the brightness of the display screen.

19. The method according to claim 17, wherein the method further comprises:

sensing, by a third photosensitive unit in the at least two photosensitive units, light energy of peripheral ambient light that is of the terminal device and that passes through the opaque ink or the low light transmittance ink, peripheral ambient light energy that passes through the transparent black ink, and the light energy of the light leakage of the display screen to obtain fifth light energy, wherein the first light energy is greater than the fifth light energy; and the removing, based on the first light energy and the second light energy by using a differential processing method, the light energy of the light leakage generated by the display screen during content display, to obtain true brightness of the peripheral ambient light to adjust brightness of the display screen comprises:

calculating brightness of first peripheral ambient light based on the first ambient light energy and the second ambient light energy;

calculating brightness of second peripheral ambient light based on the first light energy and the fifth light energy; and calculating an average value of the brightness of the first peripheral ambient light and the brightness of the second peripheral ambient light to adjust the brightness of the display screen.

20. The method according to claim 17, wherein in a case that a wavelength of the peripheral ambient light is 550 nanometers, a light transmittance of the transparent black ink is 5%, and a light transmittance of the opaque ink or the low light transmittance ink is less than 5‰.

* * * * *